US010626279B2

(12) United States Patent
Kulkarni et al.

(10) Patent No.: US 10,626,279 B2
(45) Date of Patent: Apr. 21, 2020

(54) COMPOSITION, SUBSTRATES AND METHODS THEREOF

(71) Applicant: Jawaharlal Nehru Centre for Advanced Scientific Research, Bangalore (IN)

(72) Inventors: Giridhar Udapi Rao Kulkarni, Bangalore (IN); Kunala Durga Mallikarjuna Rao, Bangalore (IN); Ritu Gupta, Bangalore (IN); Boya Radha, Bangalore (IN); Shanmugam Kiruthika, Bangalore (IN)

(73) Assignee: JAWAHARLAL NEHRU CENTRE FOR ADVANCED SCIENTIFIC RESEARCH, Bangalore (IN)

( * ) Notice: Subject to any disclaimer, the term of this patent is extended or adjusted under 35 U.S.C. 154(b) by 884 days.

(21) Appl. No.: 14/773,040

(22) PCT Filed: Mar. 4, 2014

(86) PCT No.: PCT/IB2014/059411
§ 371 (c)(1),
(2) Date: Sep. 4, 2015

(87) PCT Pub. No.: WO2014/136039
PCT Pub. Date: Sep. 12, 2014

(65) Prior Publication Data
US 2016/0009928 A1    Jan. 14, 2016

(30) Foreign Application Priority Data
Mar. 5, 2013   (IN) .............................. 954/CHE/2013

(51) Int. Cl.
*B32B 5/16*      (2006.01)
*C09D 5/28*      (2006.01)
(Continued)

(52) U.S. Cl.
CPC ............... *C09D 5/28* (2013.01); *B05D 1/005* (2013.01); *B05D 1/02* (2013.01); *B05D 3/065* (2013.01);
(Continued)

(58) Field of Classification Search
CPC ......................... Y10T 428/24471; C09D 5/28
See application file for complete search history.

(56) References Cited

U.S. PATENT DOCUMENTS

| 3,769,063 | A | * | 10/1973 | Kizawa | ................. | B05D 5/062 427/257 |
| 2005/0137268 | A1 | * | 6/2005 | Kim | ..................... | C01B 33/145 516/81 |

(Continued)

OTHER PUBLICATIONS

International Search Report and Written Opinion, issued in the corresponding PCT application No. PCT/IB2014/059411, dated Jul. 30, 2014, 11 pages.

(Continued)

*Primary Examiner* — William P Watkins, III
(74) *Attorney, Agent, or Firm* — Hamre, Schumann, Mueller & Larson, P.C.

(57) ABSTRACT

The present disclosure provides compositions comprising colloidal matter in solvent, employed for crackle formation when exposed to surface of a substrate. The said compositions crackle spontaneously without any external stimuli when exposed to the substrate surface as a film. The present disclosure also relates to substrates having a film by exposure to said composition and a method of preparing said substrate. The present disclosure also relates to patterned substrates fabricated with material or energy inputs deposited in template formed by crackling of the film and a method of preparing said patterned substrate and a kit for obtaining such substrates. The present disclosure also relates (Continued)

Figure 1:
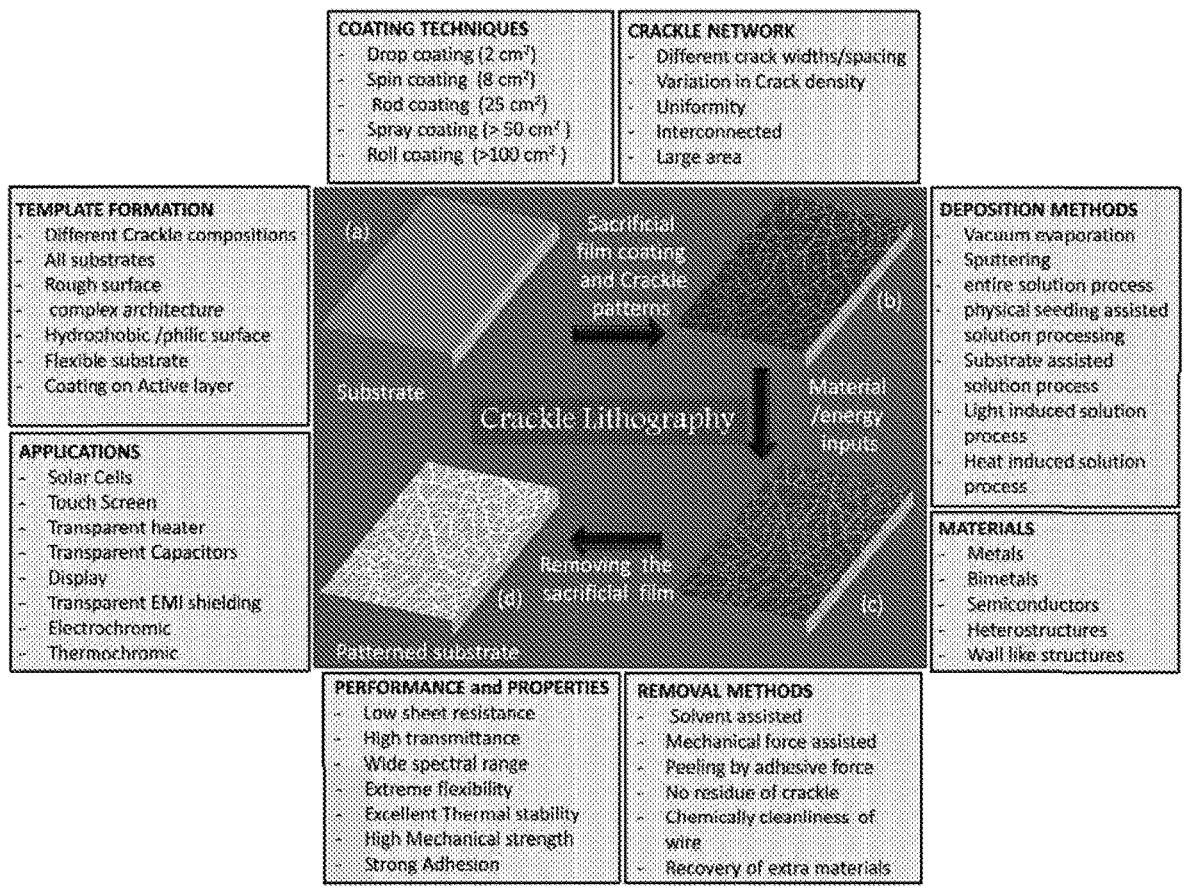

to using the said substrates for various applications specifically in the field of electronics or optoelectronics.

13 Claims, 29 Drawing Sheets

(51) Int. Cl.
- H01L 51/00 (2006.01)
- B05D 1/00 (2006.01)
- B05D 1/02 (2006.01)
- B05D 3/06 (2006.01)
- H01B 1/02 (2006.01)
- B82Y 30/00 (2011.01)

(52) U.S. Cl.
CPC ........... *H01B 1/02* (2013.01); *H01L 51/0021* (2013.01); *B82Y 30/00* (2013.01); *Y02E 10/549* (2013.01); *Y10T 428/24471* (2015.01)

(56) References Cited

U.S. PATENT DOCUMENTS

| | | | | |
|---|---|---|---|---|
| 2009/0018219 A1* | 1/2009 | MacDonald | .......... | C01B 33/141 516/34 |
| 2009/0256118 A1 | 10/2009 | Tanaka et al. | | |
| 2010/0167078 A1* | 7/2010 | Kim | .......... | B29C 48/04 428/546 |
| 2012/0010760 A1 | 5/2012 | Weitz et al. | | |

OTHER PUBLICATIONS

Xu et al., "Drying-Induced Cracks in Thin Film Fabricated from Colloidal Dispersions", Drying Technology, vol. 27, pp. 636-652, 2009 and can be found at: http://www.tandfonline.com/doi/abs/10.1080/07373930902820804#preview>entiredocument.

Rugge et al., "Tungsten Nitride Inverse Opals by Atomic Layer Deposition", Nano Letters, vol. 3, No. 9, pp. 1293-1297, 2003 and can be found at: http://faculty.chemistry.harvard.edu/files/gordon/files/nano.pdf.

Kim et al., "Electrical, optical, and structural properties of indium-tin-oxide thin films for organic light-emitting devices", American Institute of Physics, vol. 86, No. 11, pp. 6451-6461, Dec. 1999 and can be found at: http://scitation.aip.org/content/aip/journal/jap?ver=pdfcov.

Edwards et al., "Basic materials physics of transparent conducting oxides", Dalton Transactions., issue 19, pp. 2995-3002, 2004 and can be found at: http://pubs.rsc.org/en/Content/ArticleLanding/2004/DT/b408864f#!divAbstract.

Geim et al., "The rise of graphene", Nature Materials, vol. 6, pp. 183-191, Mar. 2007 and can be found at: http://www.nature.com/nmat/journal/v6/n3/full/nmat1849.html.

Bae et al., "Roll-to-roll production of 30-inch graphene films for transparent electrodes", Nature Nanotechnology Letter, vol. 5, pp. 574-578, Aug. 2010 and can be found at: http://www.nature.com/nnano/journal/v5/n8/full/nnano.2010.132.html.

Nam et al., "Patterning by controlled cracking", Nature Letter, vol. 485, pp. 221-224, May 10, 2012 and can be found at: http://www.nature.com/nature/journal/v485/n7397/full/nature11002.html.

Nunes et al., "Effect of different dopant elements on the properties of ZnO thin films", Vacuum, vol. 64, pp. 281-285, 2002.

Rakhshani et al., "Electronic and optical properties of fluorine-doped tin oxide films", Journal of Applied Physics, vol. 83, issue 2, pp. 1049-1057, Jan. 15, 1998 and can be found at: http://scitation.aip.org/content/aip/journal/jap/83/2/10.1063/1.366796.

Gordon, "Criteria for Choosing Transparent Conductors", MRS Bulletin, pp. 52-57, Aug. 2000 and can be found at: http://www.researchgate.net/publication/231747341_Criteria_for_choosing_transparent_conductors._MRS_Bull.

Girtan et al., "Role of ITO and PEDOT: PSS in stability/degradation of polymer: fullerene bulk heterojunctions solar cells", Solar Energy Materials & Solar Cells, vol. 94, pp. 446-450, 2010.

* cited by examiner

COMPOSITION, SUBSTRATES AND METHODS THEREOF

TECHNICAL FIELD

The present disclosure is in relation to material science, which provides compositions comprising colloidal matter in solvent, employed for crackle formation when exposed to surface of a substrate. The said compositions crackle spontaneously without any external stimuli when exposed to the substrate surface as a film. The present disclosure also relates to substrates having a film by exposure to said composition and a method of preparing said substrate. The present disclosure also relates to patterned substrates fabricated with material or energy inputs deposited in template formed by crackling of the film and a method of preparing said patterned substrate and a kit for obtaining such substrates. The present disclosure also relates to using the said substrates for various applications specifically in the field of electronics or optoelectronics.

BACKGROUND AND PRIOR ART OF THE DISCLOSURE

Electronics are engulfing every discipline of human life, the reverberation of which is found in consistent research to develop improved products. Broadly, while the research is focussing on the physiology of the electronic gadgets to make it more enduring with additional loads, anatomically they are being made compact. The constant endeavour to achieve the said progression has been invariably through new materials and methods.

In the discipline of optoelectronics, the thrust to develop an alternate to the expensive and brittle Indium-tin-oxide (ITO) is increasing. Indium-tin-oxide has been the cynosure of the organic light emitting diodes, solar cells and the like because of the unique combination of the advantage it offers over the other materials like high electrical conductivity and optical transparency. Indium oxide optimally doped with tin is unique in this respect. It retains its optical band gap (~4 eV) yet exhibits high conductance arising because of tin donating electrons to the conduction band (Kim, H. et al; *J. Appl. Phys.* 86, 6451-6461, 1999). A good ITO film can transmit up to ~92% of visible light and show a sheet resistance ($R_s$) of ~11 Ω/square which explains its widespread use as electrode material in display devices.

Alternatives to ITO such as fluorine doped tin oxide (FTO), (Rakhshani, A. E. et al; *J. Appl. Phys.* 83, 1049-1057, 1998; Nunes, P. et al; *Vacuum* 64, 281-285, 2002) and other oxide systems (Edwards, P. P. et al; *Dalton Trans.* 19, 2995-3002, 2004; Gordon, R. G. *MRS Bull.* 25, 52-57, 2000), have been explored but their performance has been found to suit only certain applications. Further oxides are poor IR and UV transmitters and are brittle, not suitable for flexible applications.

An attractive alternate to ITO is graphene (Geim, A. K. et al; *Nat. Mater.* 6, 183-191, 2007). However, obtaining extended layers of graphene can be process intensive and cost forbidding (Bae, S. et al; *Nat. Nanotechnol.* 5, 574-578, 2010). The organic equivalent to ITO is poly(3,4-ethylenedioxythiophene) (PEDOT) and its derivatives, but they suffer from limited conductivity and stability besides being expensive (Girtan, M. et al; *Sol. Energ. Mat. Sol.* 94, 446-450, 2010).

Fabricated devices like transistors, gas sensors, solar cells, IR detectors comprise suitably patterned materials for their application. Patterning of materials with wires of different dimensions, millimetre to submicrometer is of immense interest owing to their unusual properties that can be harnessed by their appropriate usage in various devices.

Cracks or discontinuations in bodies are one of the undesired manifestations of the stress induced through the surface of the bodies. The cracks are a common phenomenon in paintings, wall surfaces and mud surface. Cracks which initially give an awkward appearance to the body in which it has developed, can be ruinous if left unattended. Substantial research has been carried out to understand the factors, which initiate and propagate cracks. The research has pointed to various factors like particle size, temperature, solvents, rate of drying, magnitude of stress, crystallographic orientation of substrates (Nam, K. H. et al; *Nature* 485, 221-224, 2012).

While the major research on cracks is oriented towards understanding and implementing the factors which can resist them, studies to exploit the cracks for various advantages including deposition of metals have not yielded appreciable results. The main reason being lameness to identify a material which can crack (more specifically crackle wherein the substrate at the bottom is exposed) or a method which renders a material to crackle in accordance with the specific need and on a large area. To be precise, material/method that is easy to adopt in the patterning of various substrates with different materials.

The literature provides information wherein different materials are induced to crack by stress through a micro notch created by ion beam etching and terminated at the free end of the sacrificial film. The prior art process are limited as they can be applied to specific substrates such as Si<110> and <100> with usage of sophisticated instruments. Further, large area is difficult to be patterned because of serial and multistep processes; known processes have been successful in patterning an area of about micrometer square regions. The etching of cracked layer requires expensive and corrosive chemicals, also the possibility of the etched layer for recycling is remote. Another major disadvantage has been discontinuation in cracks without interconnection and the dimensions of the cracks being uncontrollable. The processes take long time for patterning and fabrication.

The present disclosure targets to provide solution at two different levels. Primarily to overcome the drawbacks/difficulties associated with the formation of crackles suitable for their usage as templates in patterning of micro and submicrometer dimensional wires of apposite materials on various substrates. Secondly, by the usage of the aforesaid patterned substrates with micro and submicrometer wires in the fabrication of various devices of electronics discipline to overcome the difficulties associated with the usage of various oxides including ITO.

The present disclosure provides a composition, which crackles when applied as thin films on various substrates and convenient to lift off. The crackles are used as templates to dope with various materials including conducting materials, semiconducting materials, insulators, dielectrics and energy, thus patterning the substrate with micro and submicrometer dimensional wires for appropriate usage in various electronic/optoelectronic devices.

STATEMENT OF THE DISCLOSURE

Accordingly, the present disclosure relates to a composition for obtaining a film on a substrate, said composition comprising colloidal matter in solvent, wherein the colloidal matter has size ranging from about 10 nm to about 150 nm and wherein the colloidal matter in the solvent is in concentration ranging from about 0.05 g/mL to about 2 g/mL; a method of obtaining a composition as above, said method comprising act of combining colloidal matter of uniform size in solvent at concentration ranging from about 0.05 g/mL to about 2 g/mL to obtain the composition; a substrate having a film obtained by exposure of the substrate to a composition as above; a method of preparing a substrate having a film as above, said method comprising act of exposing surface of the substrate to a composition as above to prepare the substrate having the film; a patterned substrate fabricated with a substrate having a material or energy input deposited in template formed by crackling of a film on surface of the substrate; a method of fabricating a patterned substrate as above, said method comprising acts of a) exposing surface of substrate to a composition as above to obtain substrate having a film, b) drying the substrate having the film to obtain crackled film on the substrate and c) depositing material or energy input in template formed by crackling of film on the surface of the substrate followed by optionally removing the film to fabricate the patterned substrate; use of a patterned substrate as above in fabricating a device, wherein the patterned substrate is connected to a device for application in electronics; and a kit for obtaining a composition as above, a substrate above or a patterned substrate as above, said kit comprising components selected from a group comprising colloidal matter, solvent, optionally a substrate, material or energy input and an instruction manual or any combination thereof.

BRIEF DESCRIPTION OF THE
ACCOMPANYING FIGURES

In order that the disclosure may be readily understood and put into practical effect, reference will now be made to exemplary embodiments as illustrated with reference to the accompanying figures. The figures together with detailed description below, are incorporated in and form part of the specification, and serve to further illustrate the embodiments and explain various principles and advantages, in accordance with the present disclosure wherein:

FIG. 1: Schematic illustration shows patterning of substrates (a) substrate (b) after forming crackle patterns by coating a crackle forming composition as a film, followed by (c) material deposition/energy input; (d) removing the sacrificial film by dipping in solvent(s). The outside boxes summarize the outcome of each step.

Figure 2:
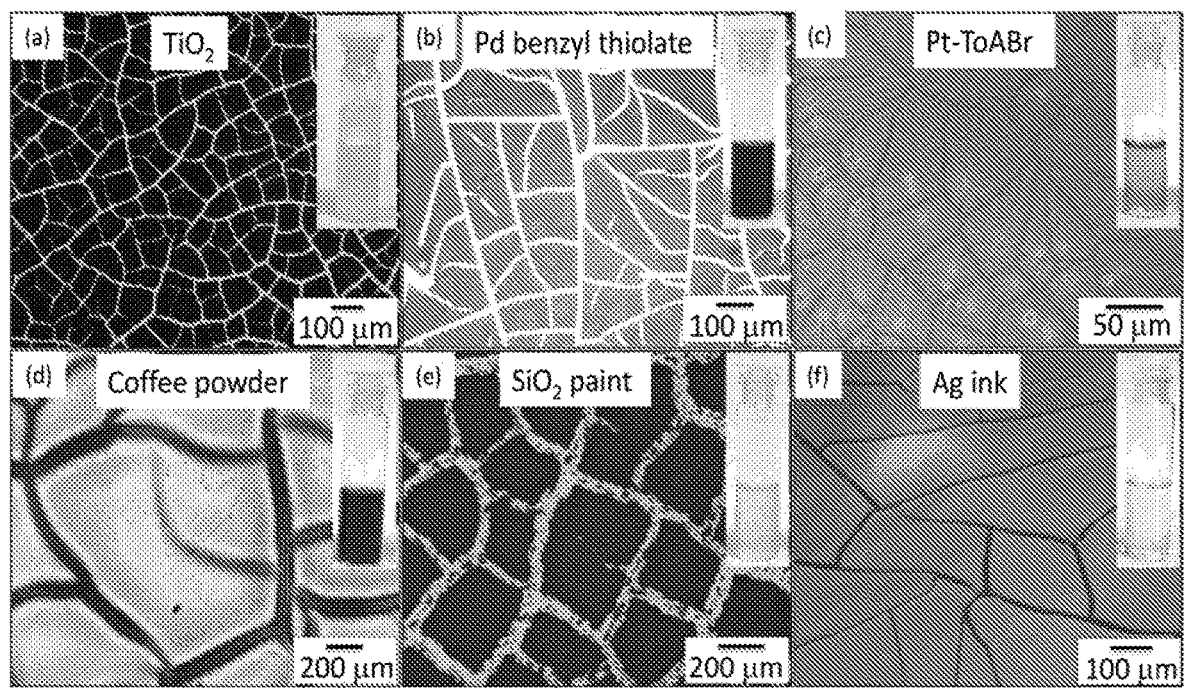

FIG. 2: Optical micrographs of the crackle patterns formed with (a) $TiO_2$ (Composition-2), (b) Pd benzylthiolate (Composition-3), (c) Pt-ToABr (Composition-4), (d) Coffee powder (Composition-5), (e) $SiO_2$ paint (Composition-6) and (f) Ag ink (Composition-7). Insets show the photographs of corresponding crackle precursors.

Figure 3:
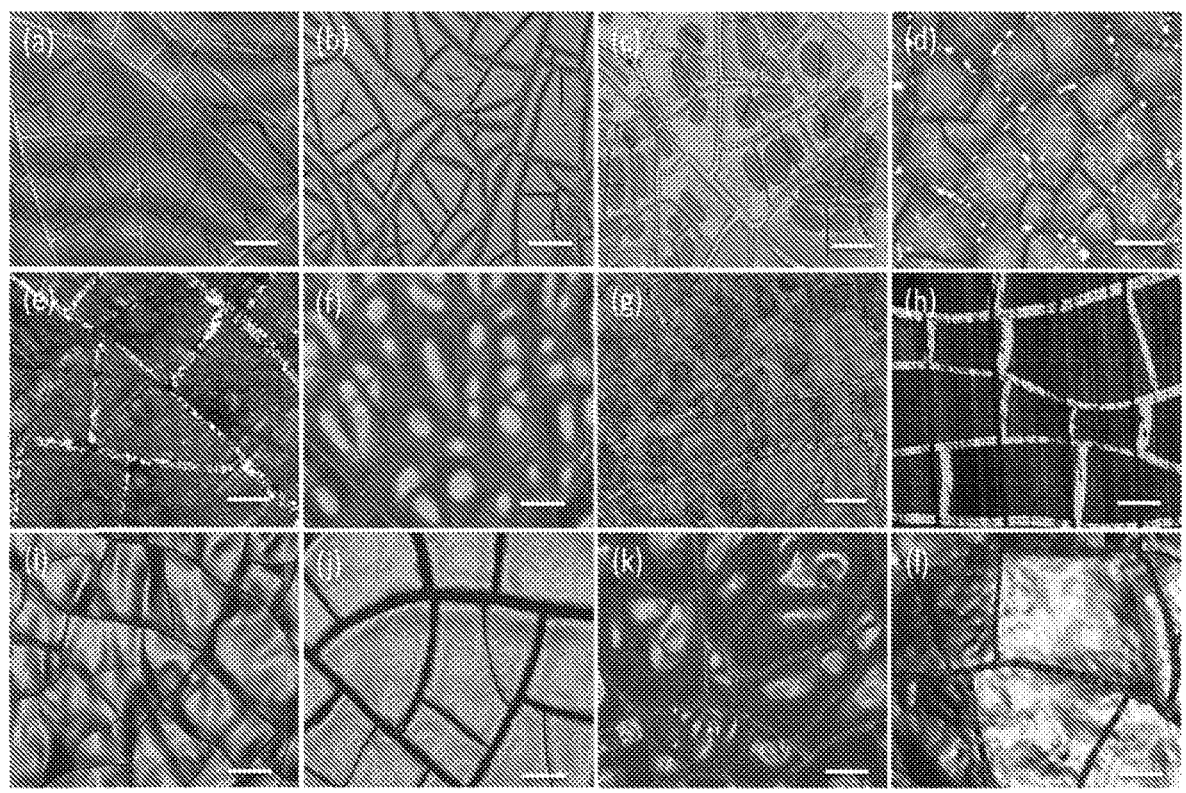

FIG. 3: Optical micrographs of crackle patterns formed on: (a) mica, (b) quartz, (c) PET, (d) unpolished Silicon, (e) Al plate, (f) ceramic, (g) wood, (h) stainless steel, (i) paper, (j) leather, (k) stone and (l) petal of a flower using crackle forming composition-I. Scale bar 100 µm. Images (a) and (i) are obtained in the reflection mode and for image in (c), both transmission and reflection illuminations are used.

Figure 4:
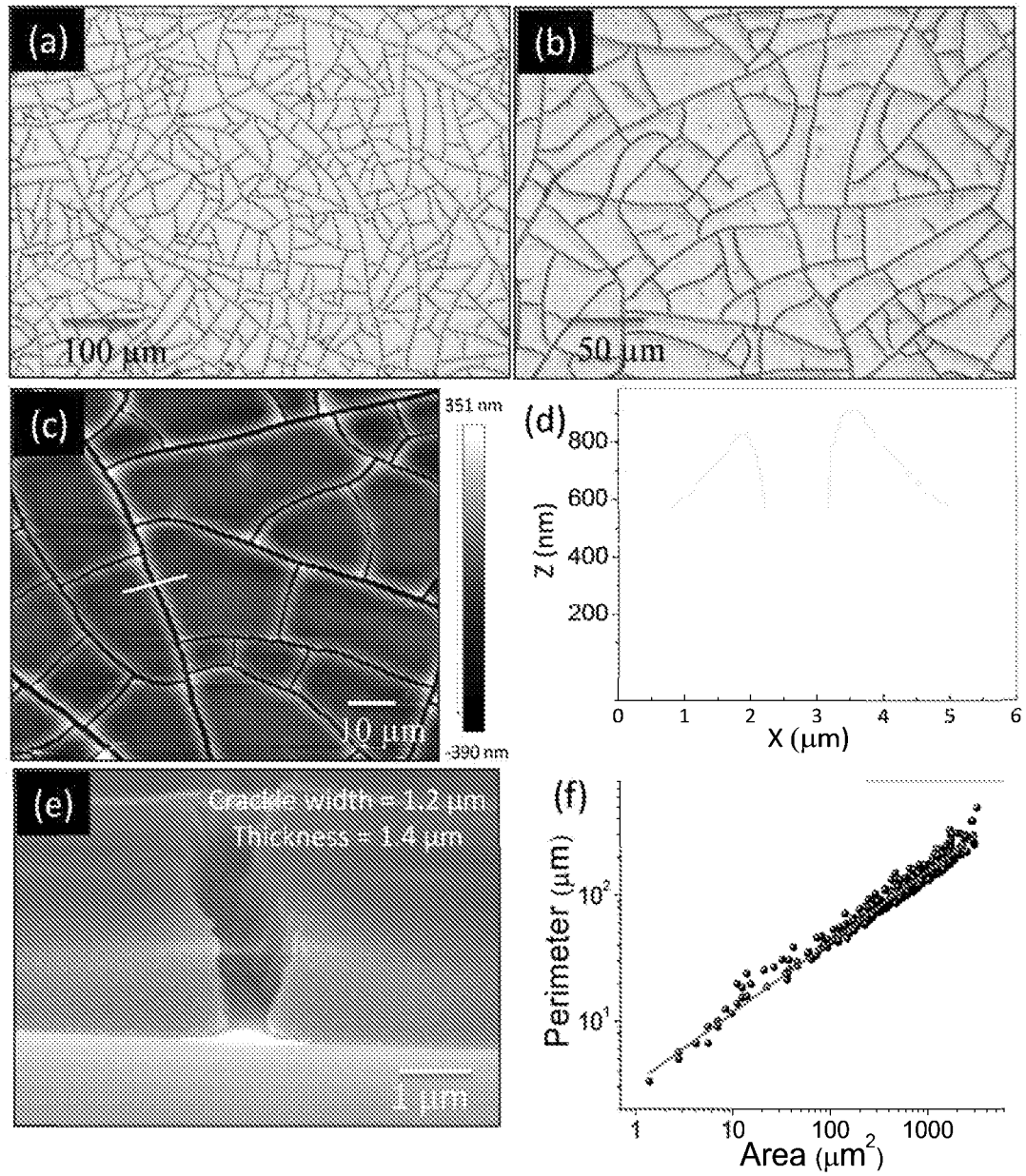

FIG. 4: Characterization of crackle patterns formed using crackle forming composition-I: (a) Optical micrograph, (b) magnified view, (c) AFM topography image, (d) the height profile of the marked region in c. (e) Tilt SEM image showing a crackled region. (f) log (perimeter)-log (area) of polygons formed in crackle patterns (solid circles and the red line are the experimental data and fitted straight line, respectively). Both, transmission and reflection illuminations are used in the case of (a) and (b).

Figure 5A:
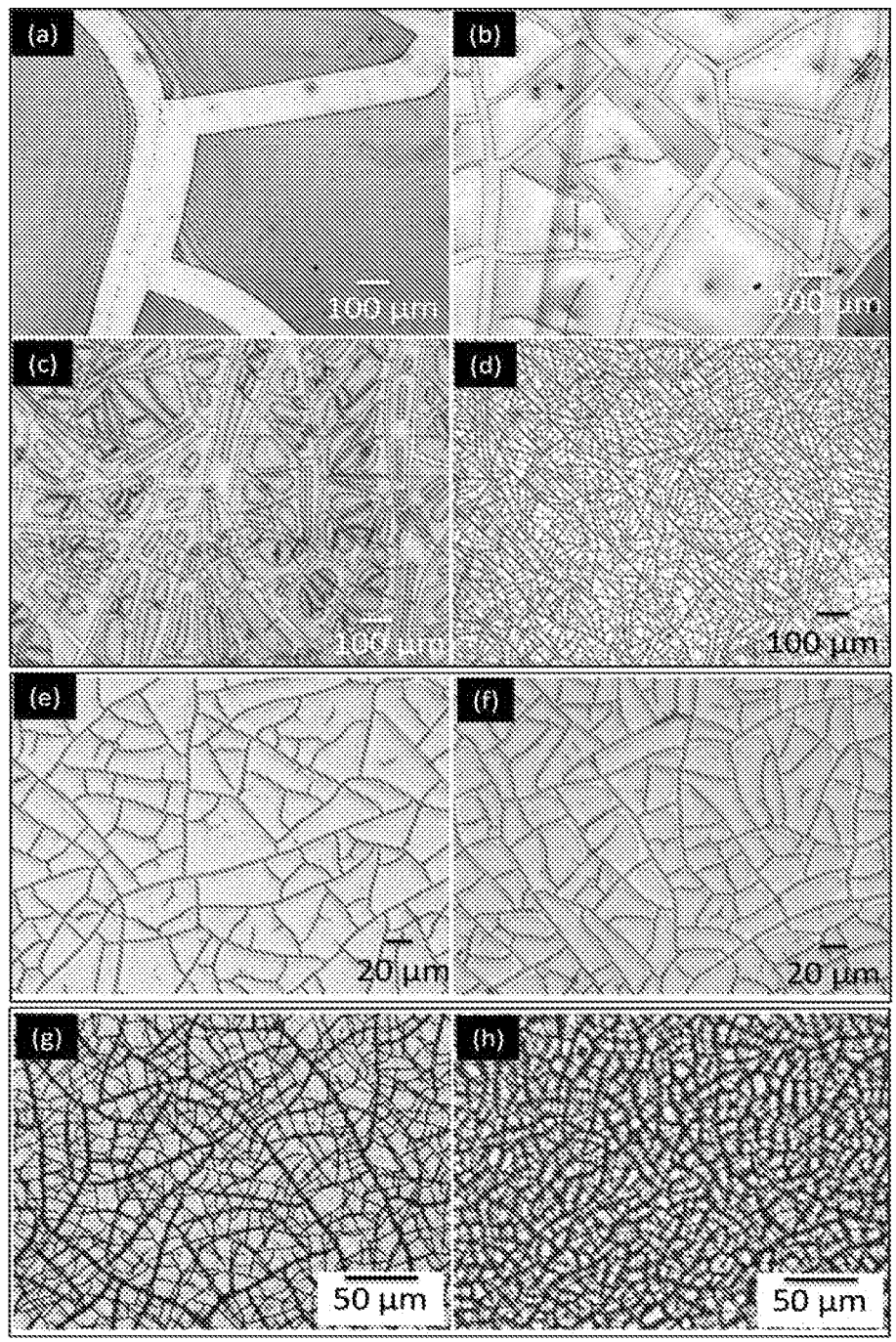

FIG. 5A: Optical micrographs of crackle patterns formed using crackle forming composition-I: (a) 1 g/mL, (b) 0.5 g/mL, (c) 0.36 g/mL and (d) 0.3 g/mL of crackle forming composition-I, is rod coated on PET. Crackle patterns formed after spin coating a 50 µL solution of 0.7 g/mL of crackle forming composition-I on a glass substrate, at (e) 1000 rpm and (f) 6000 rpm for 60 s. Optical micrographs of crackle patterns after coating (g) second and (h) third layer of crackles. Both, transmission and reflection illuminations have been used.

Figure 5B:
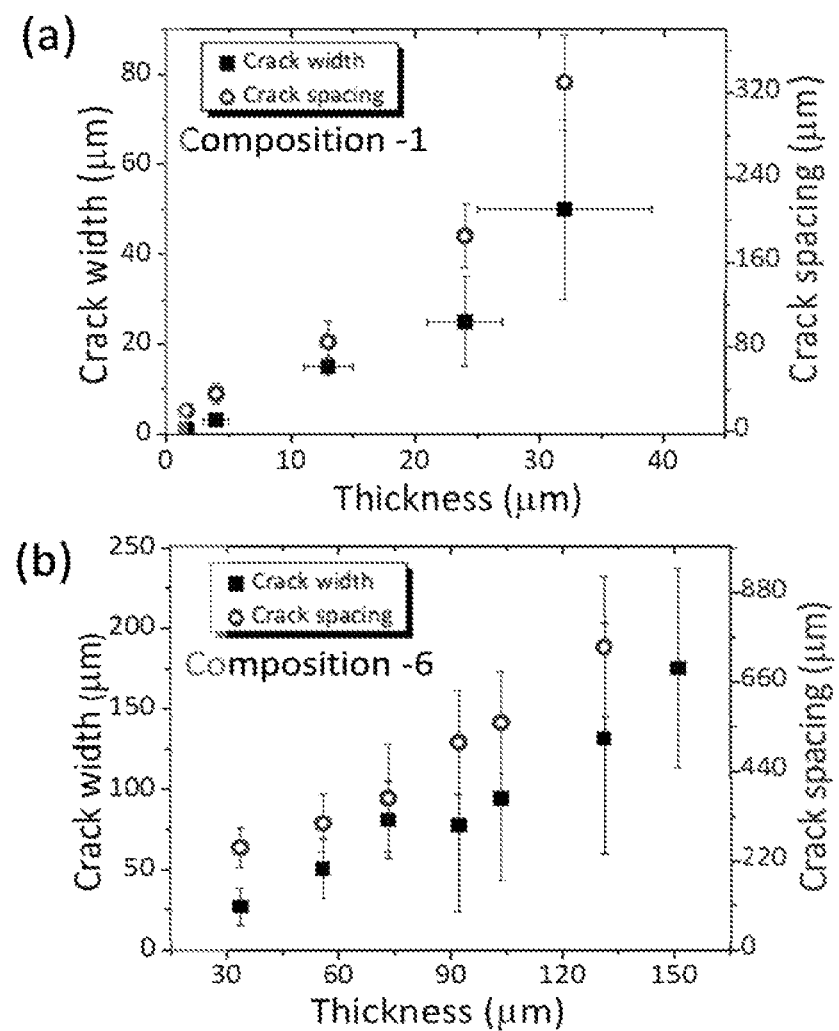

FIG. 5B: (a and b) show crackle width and crack spacing as a function of crackle film thickness for crackle forming composition-1 and 6 respectively. Yellow region denotes layer thicknesses below the critical thickness in which no cracks form.

Figure 6:
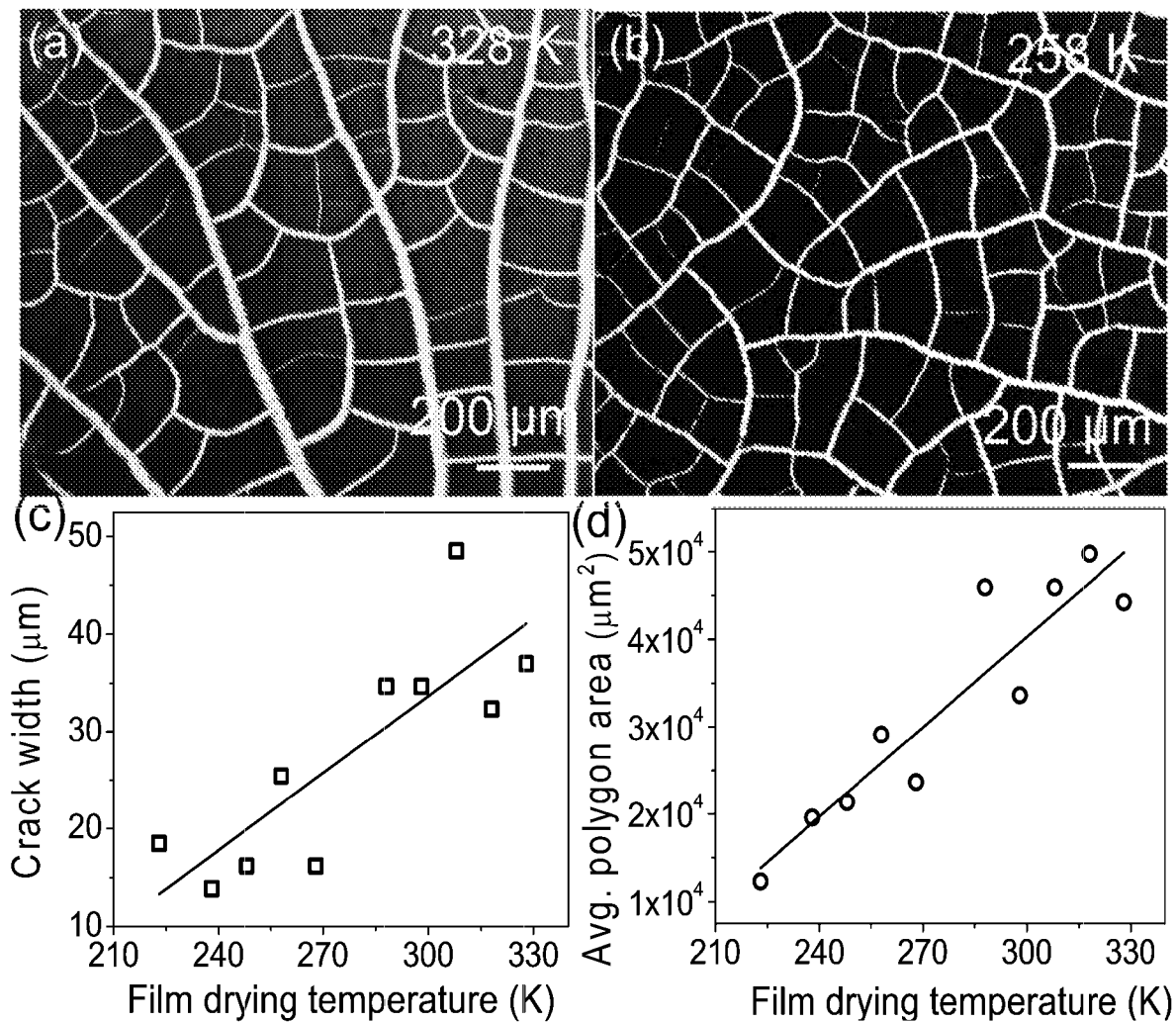

FIG. 6: Optical microscopic images of interconnected crackles formed using crackle forming composition-2, when dried at 328 K (a) and 258 K (b) under nitrogen flow. (c) A plot of maximum crack width versus the drying temperature. (d) A plot of average polygon area of crackles versus the drying temperature.

Figure 7:
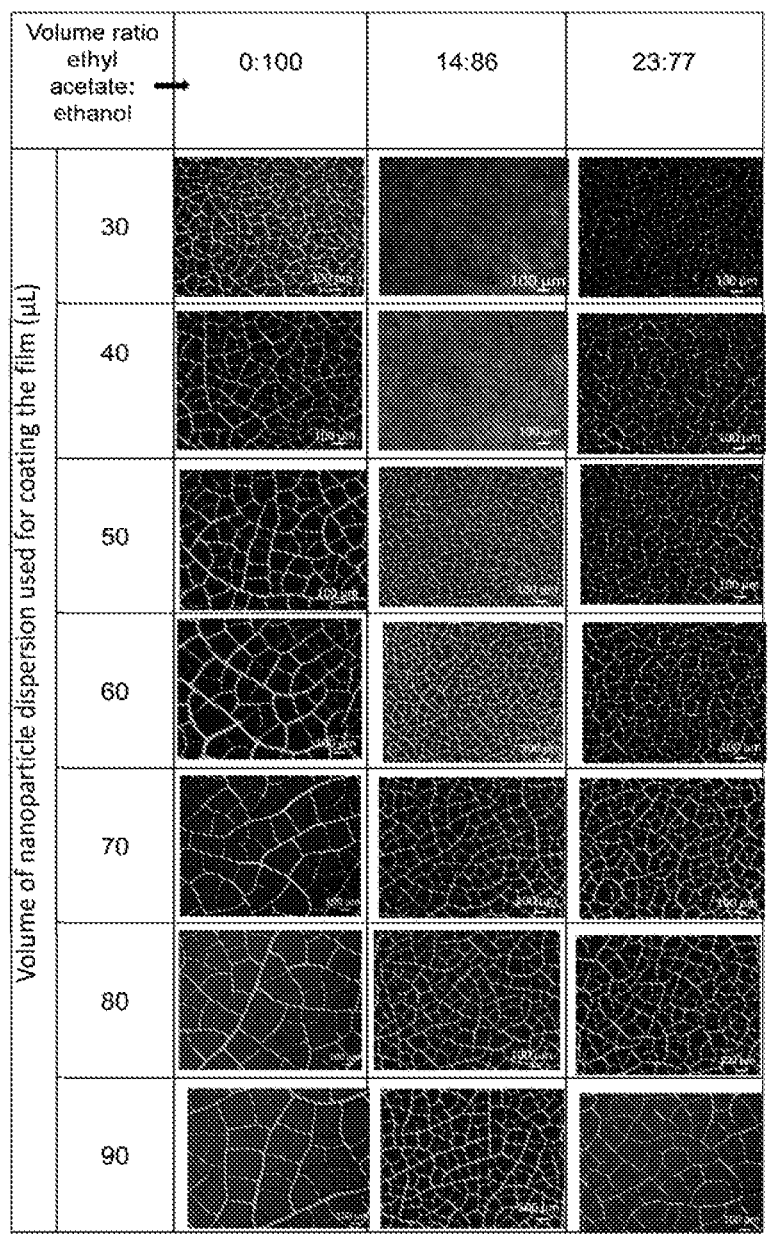

FIG. 7: The process of optimization for crackles formed using crackle forming composition-2: The volume ratio of ethyl acetate (EtAc) and ethanol (EtOH) and the volume of nanoparticle dispersion used for controlling film thickness are varied. In the absence of ethyl acetate, the $TiO_2$ nanoparticle dispersion in ethanol (0.08 g/mL) produced polygons that are relatively large in size, while addition of 0.3 mL to the dispersion made cracks less interconnected. In general, increasing volume of the dispersion for coating increased crack width and the polygonal size. A coating obtained with 70 µL of the dispersion containing 0.16 mL ethyl acetate, is found appropriate.

Figure 8:
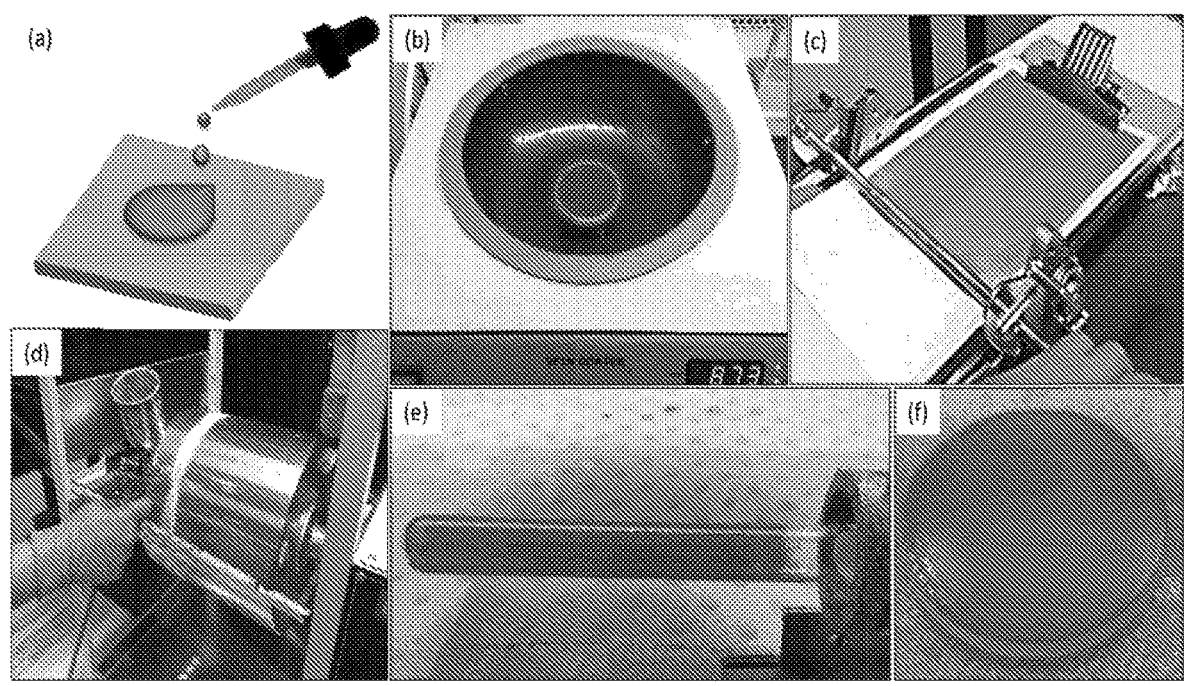

FIG. 8: Formation of crackle template using various techniques with crackle forming composition-1 and composition-2: (a) Schematic illustration of drop coating, photographs of (b) spin coating, (c) rod coating, (d) Roll-to-Roll spray coating. Spray coated glass tube (e) and convex lens (f).

Figure 9:
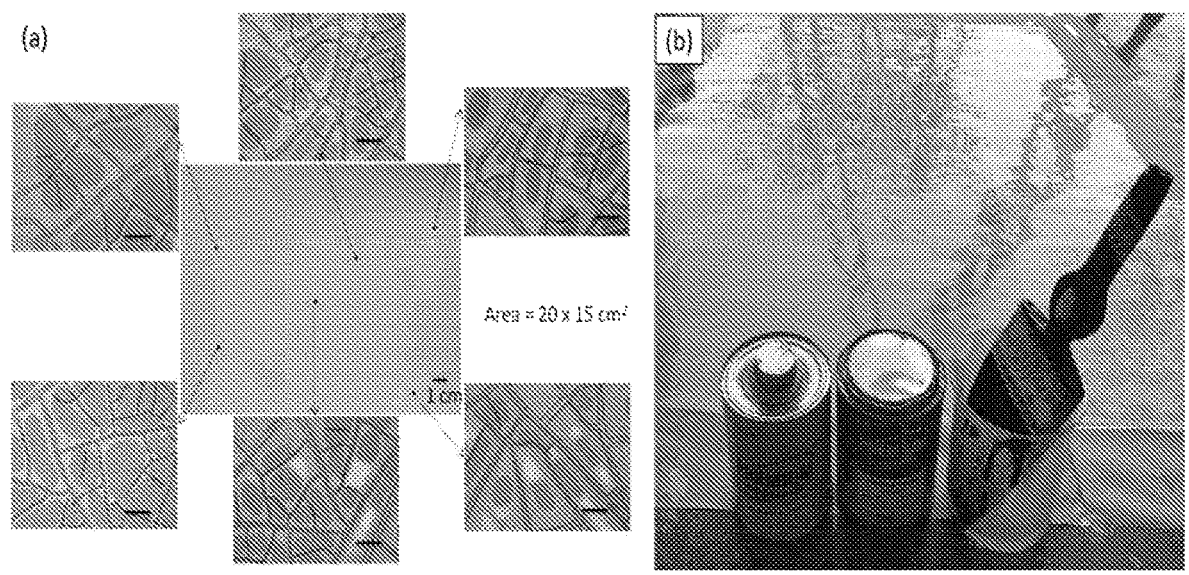

FIG. 9: (a) Photograph of a rod coated crackle patterns formed using crackle forming composition-1 over 20×15 $cm^2$ area, surrounded by optical micrographs taken at random locations indicated with black dots (scale bar 50 µm). (b) Photograph of a drop coated crackle patterns formed using crackle forming composition-3 over 155×102 $cm^2$ area using paint brush.

Figure 10:
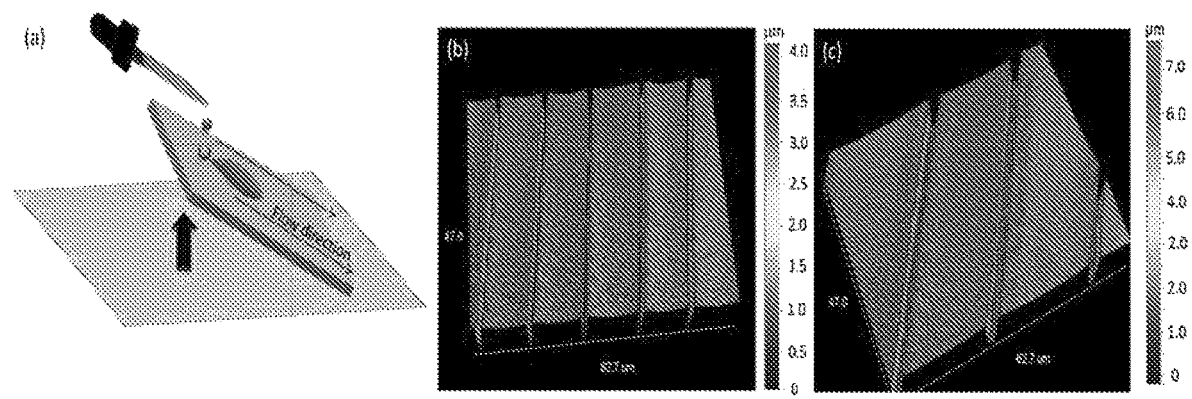

FIG. 10: (a) Schematic illustration of formation of linear patterns formed using crackle forming composition-1. b, c) Optical profilometric images of linear patterns with two different grating periods.

Figure 11:
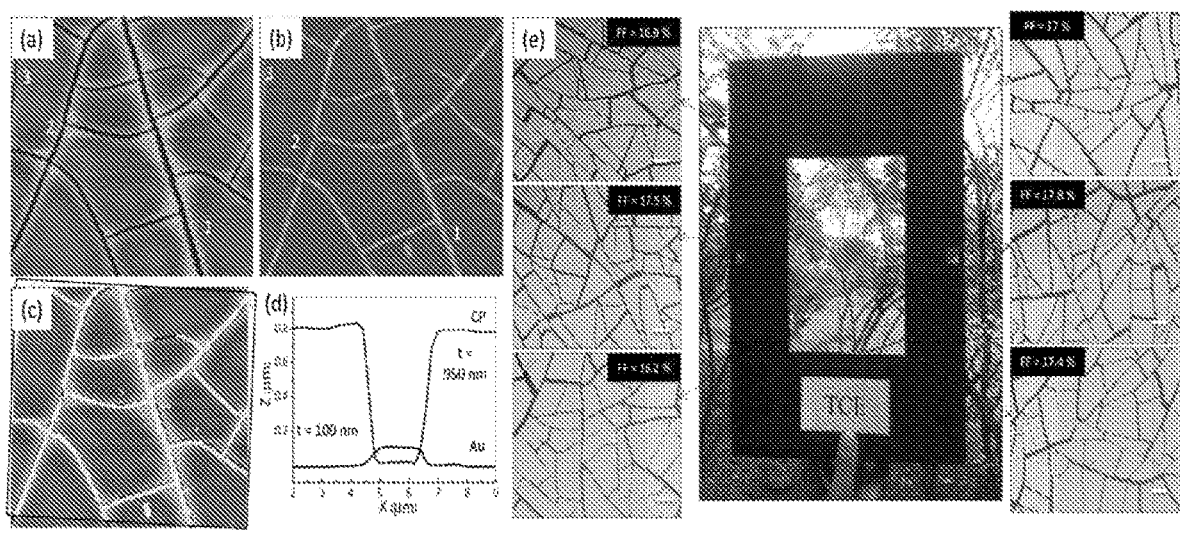

FIG. 11: a), b) are the AFM topography images (80×80 $µm^2$) respectively of the crackle patterns formed using crackle forming composition-1 and of Au in crackle pattern (AuCP). c) Images in a) and b) overlapped (AuCP is shown in white color). d) Depth profile of a crackle groove (blue curve) and height profile of AuCP (black curve). (e) A garden viewed through an AuCP/PET derive metal network over 15×20 $cm^2$. Optical micrographs from the marked regions are shown alongside (scale bar, 40 µm).

Figure 12:
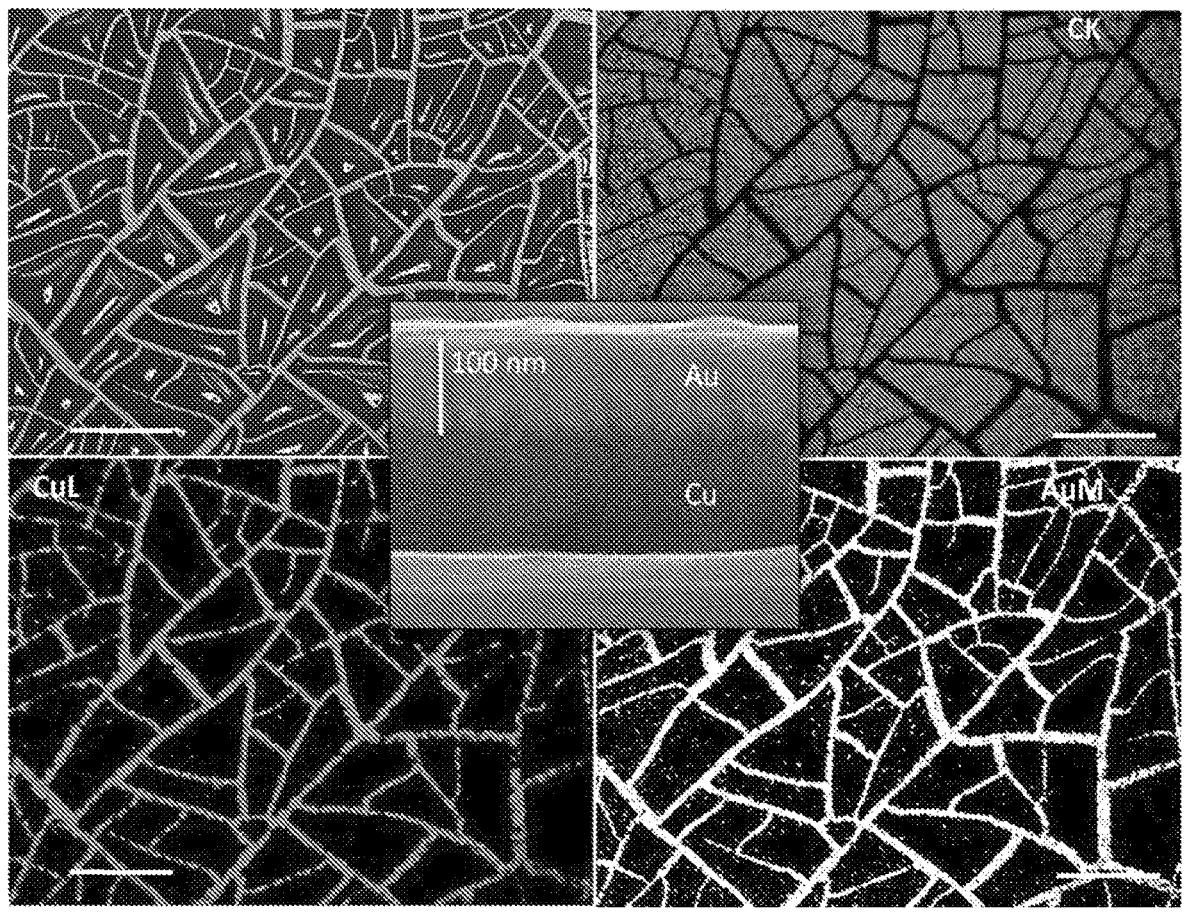

FIG. 12: SEM image and EDS maps from the same region corresponding to CK, CuL and AuM levels from Au-Cu/PET. Scale bar, 100 µm. Note: As the substrates are insulating, SEM images show unusually bright contrast. The inset in the center shows cross sectional image of the hybrid structure.

Figure 13:
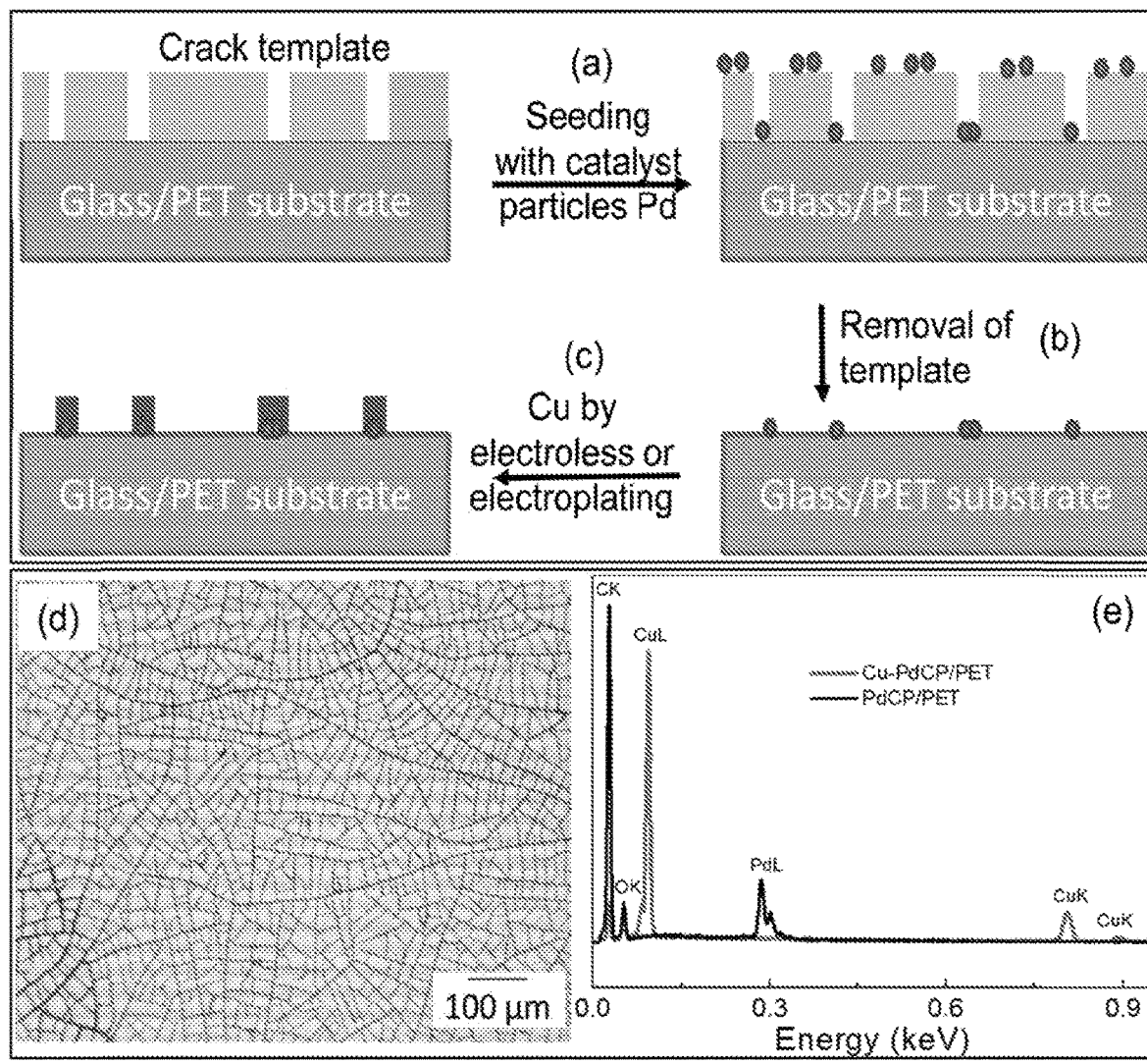

FIG. 13: (a) Schematic showing Cu metal wire network based TCE fabrication using solution route. (a) Seeding of catalyst particles in the crackle grooves formed using crackle forming composition-1, (b) removal of cracked template, (c) Cu deposition by electroless method or by electroplating. (d) Optical micrograph of the PdCP/PET seed layer, (e) EDAX spectrum of Pd seed layer and after electroless deposition of Cu.

Figure 14A:
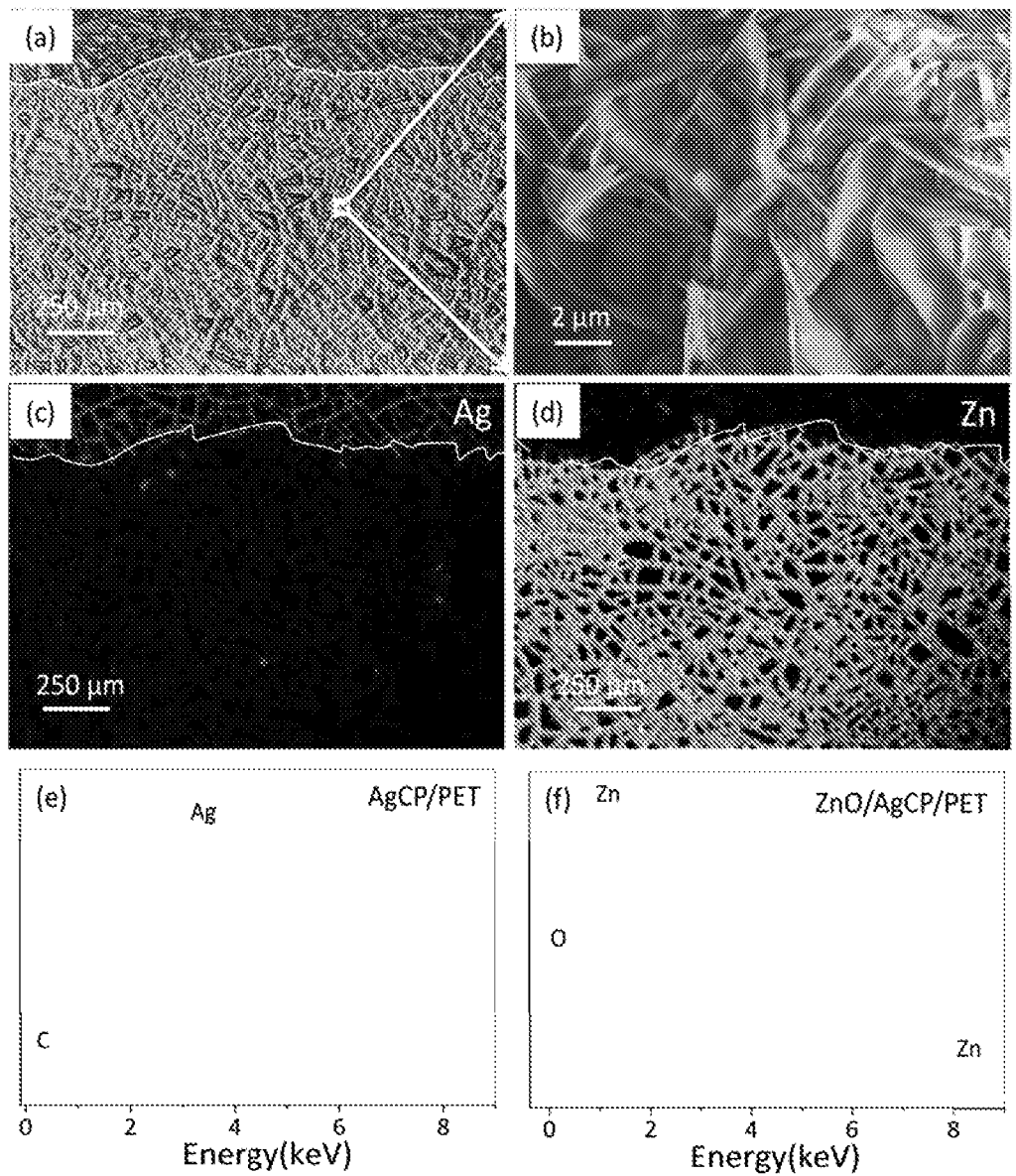

FIG. 14A: Electrochemical deposition of ZnO: (a) SEM image of ZnO electrochemically deposited on AgCP/PET. The boundary line (white) demarcates the region that is dipped in the electrolyte solution from the pristine region. (b) magnified view of ZnO. EDS maps of the same region corresponding to (c) AgL and (d) ZnK. EDS spectra from (e) AgCP/PET and (f) ZnO/AgCP/PET regions are also shown.

Figure 14B:
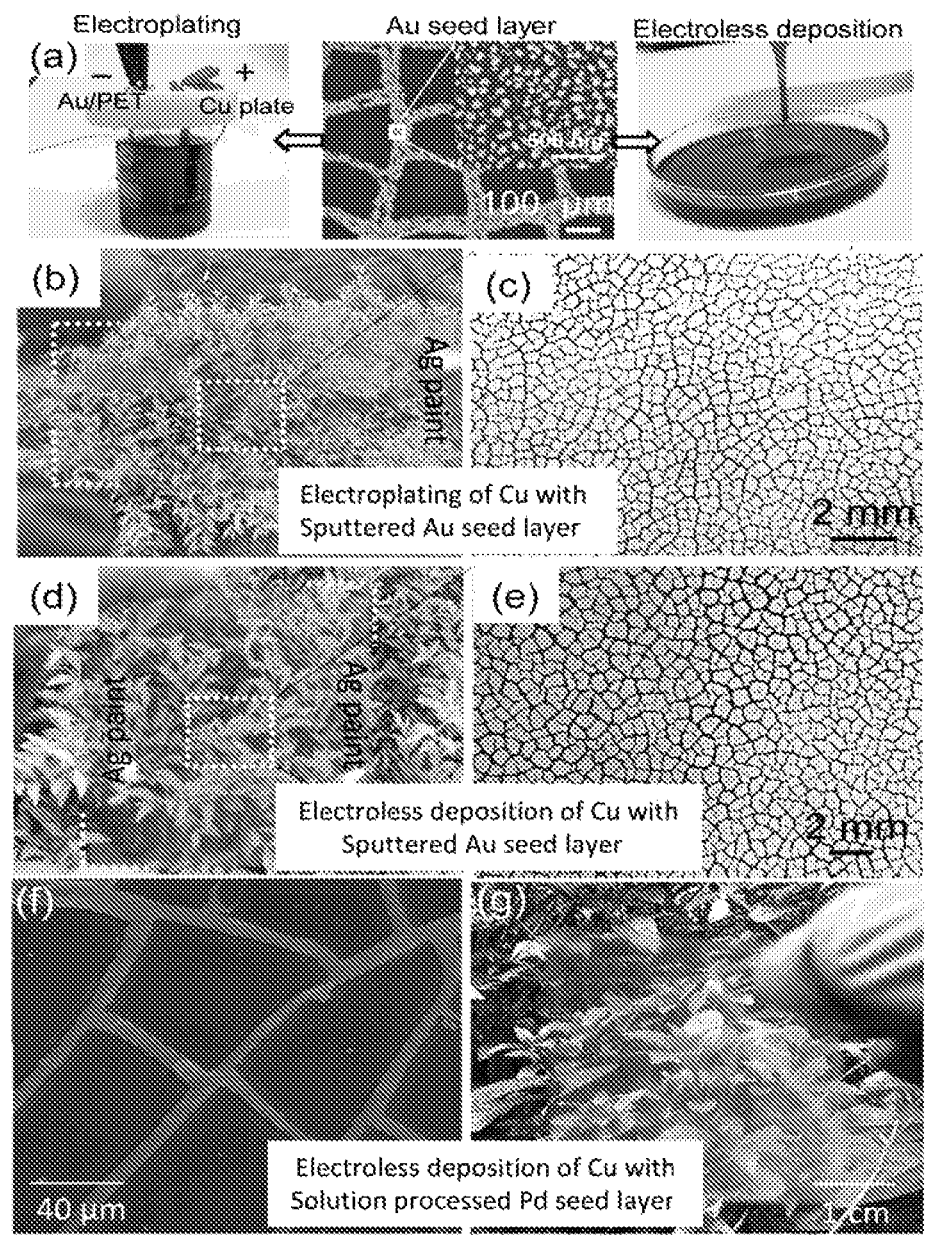

FIG. 14B: (a) Cu deposition over Au seeds by electroless and electroplating methods. Photographs of the substrates electroplated (b) and electrolessly deposited (d) with Cu and the respective zoomed in microscopic images are in (c) and (e). (f) SEM image of Cu electrolessly deposited on Pd (g) A photograph of a flowering plant as seen through a Cu wire network TCE.

Figure 15A:
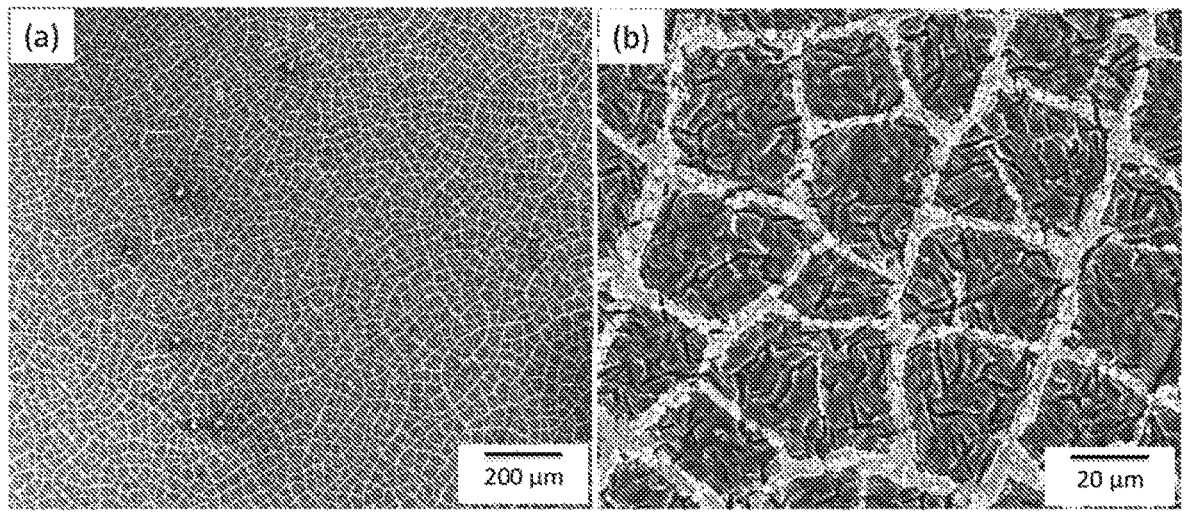

FIG. 15A: (a) SEM images of Au wire network on unpolished silicon surface over 1.4×1.2 mm$^2$ area, (b) magnified view.

Figure 15B:
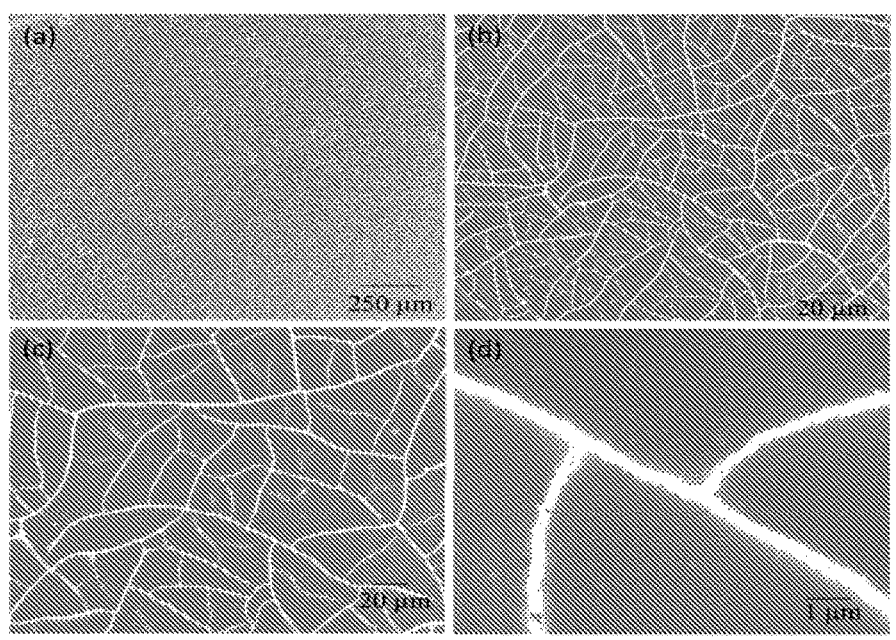

FIG. 15B: SEM images of crackle patterned Au wire network on silicon substrate deposited by chemical means: (a) large area (b) magnified view, (c) further magnified view and (d) individual Au wires with widths in submicron dimension. (crackle forming composition-1)

Figure 16:
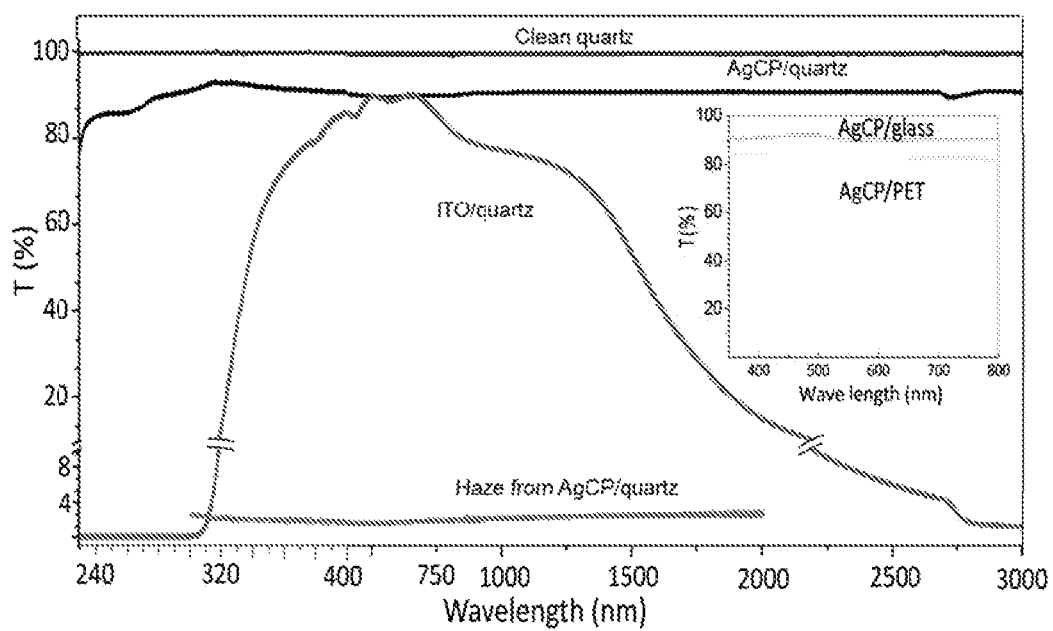

FIG. 16: Transmittance and sheet resistance of MCP derived TCEs. a) Transmittance spectrum of AgCP/quartz compared with that of ITO/quartz over a broad wavelength range covering UV, visible and IR (with UV region expanded). The haze data (pink curve) is also shown between 300 and 2000 nm. Inset shows the transmittance of AgCP/PET and AgCP/glass in the visible range.

Figure 17:
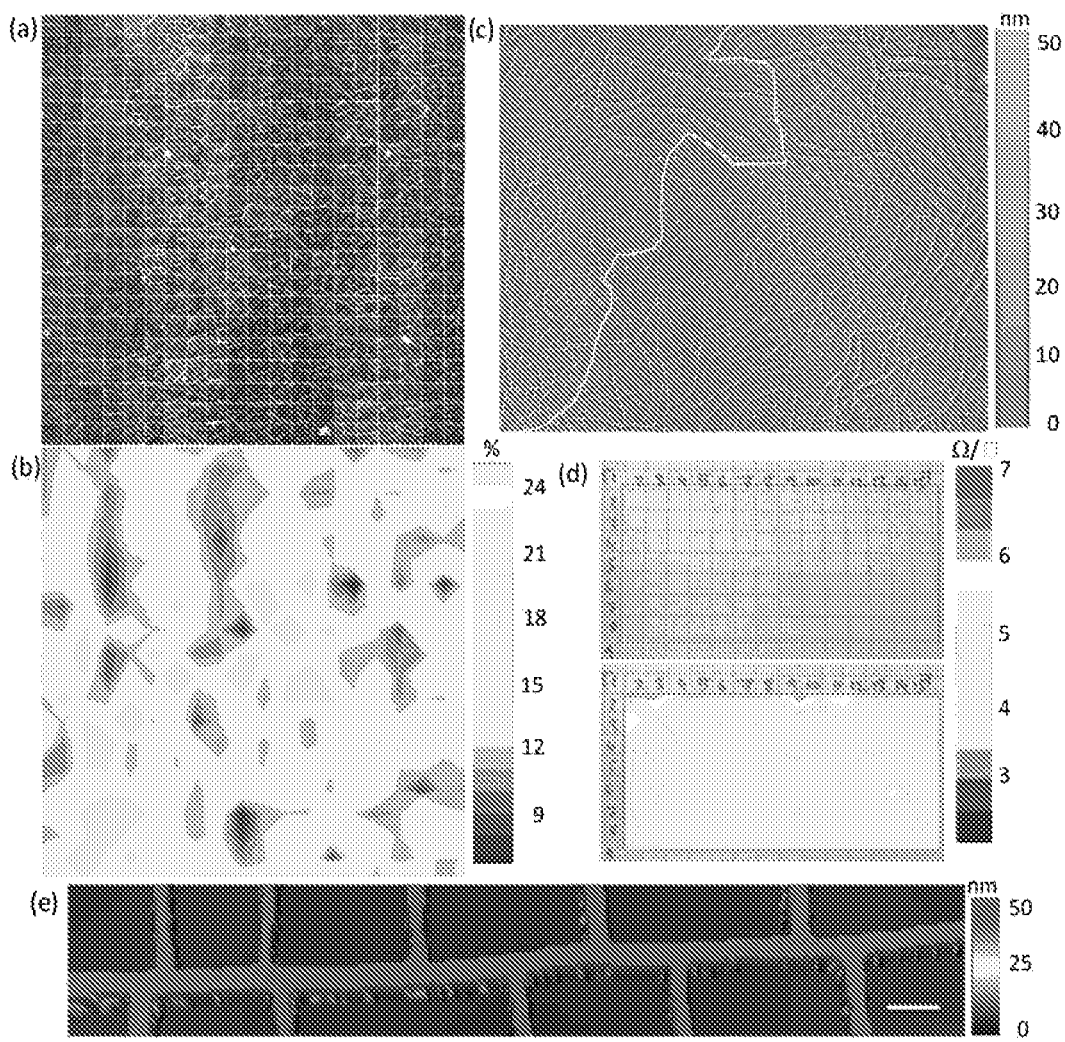

FIG. 17: Uniformity of the MCP derived TCE. a) Four hundred high resolution SEM images (each square region is 60×60 μm$^2$) of a AuCP/PET stitched to cover 1.2×1.2 mm$^2$ area. Note: The contrast is slightly varied among the images. b) Spatial distribution of the 2D metal fill factor (in %) estimated from the SEM images. c) Optical profilometric image of an AuCP/glass over 1.1×1.3 mm$^2$ area. d) Top panel: Photograph of an AgCP/PET placed over a paper marked with a grid (3.5×7 cm$^2$), bottom panel: Spatial map of $R_s$ corresponding to the grid. e) Optical profilometric image of a single Au wire, scale bar 4 μm.

Figure 18:
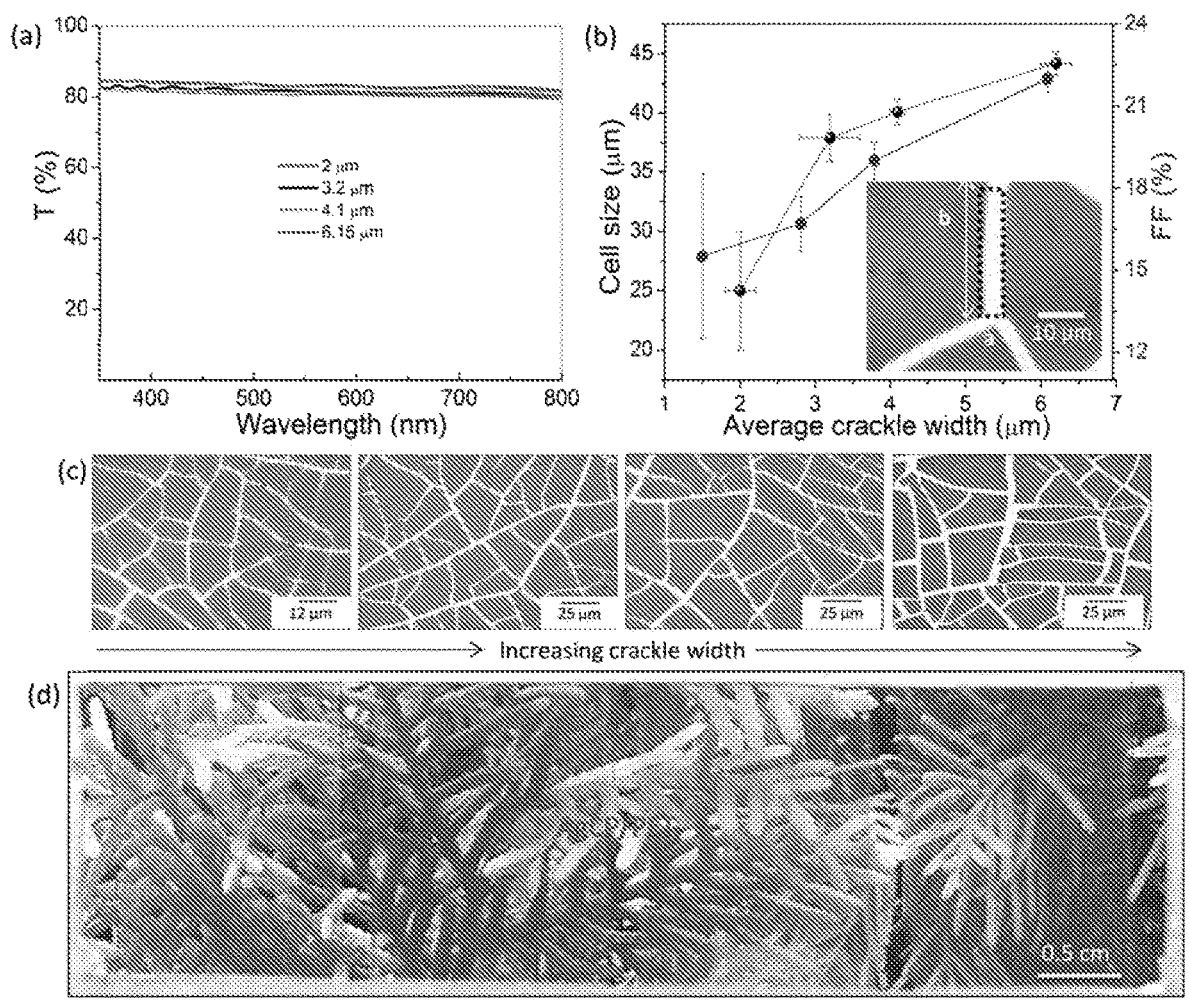

FIG. 18: (a) Transmittance of AgCP/PET derived TCEs with various wire widths. In all cases, the wire thickness is kept similar (~550 nm). (b) Variations in the average cell size (square root of area) and metal fill factor (FF %) with the average crackle width. Inset shows an optical micrograph of the Ag wire with 5 μm (c) Optical micrographs of AgCP/PET with average crackle widths of 2, 3.2, 4.1 and 6.2 μm, respectively, (d) TCEs stuck on a cardboard slot and the view of a plant behind.

Figure 19:
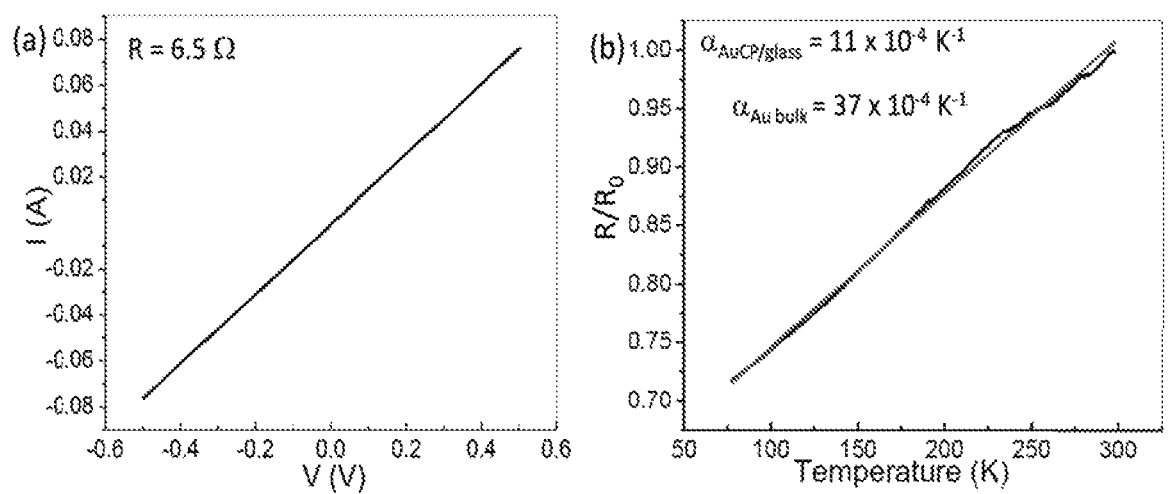

FIG. 19: (a) I-V characteristics of AuCP/glass derived TCE at room temperature. (b) Temperature dependence of the resistance, normalized with respect to room temperature, from 298 to 77 K (black curve). The red line is a linear fit to the data.

Figure 20:
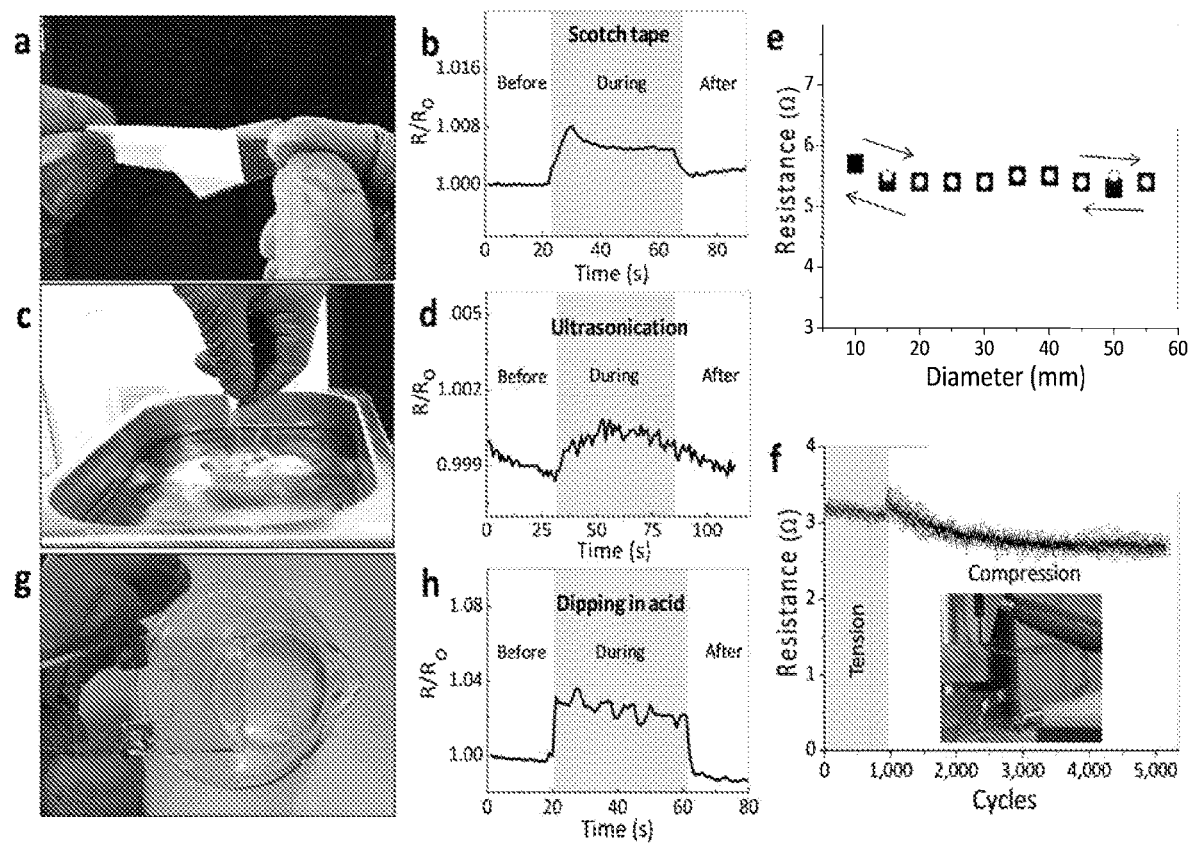

FIG. 20. Mechanical, chemical stability and flexibility of AgCP/PET. a) Adhesion tolerance test on an AgCP/PET using a scotch tape and b) the relative change in resistance during the scotch tape adhesion test. c) AgCP/PET subjected to ultrasonication d) the relative change in resistance during the sonication test. e) Resistance of AgCP/PET as function of bending diameter, during bending (solid black squares) and relaxing (open red circles). f) Resistance variation over a large number of tension and compression cycles recorded using an automated setup (inset). g) A Au-CrCP/glass derived TCE (2×2.5 cm$^2$ area) dipped in concentrated sulphuric acid in a beaker, h) the relative change in resistance during the acid-dip test.

Figure 21:
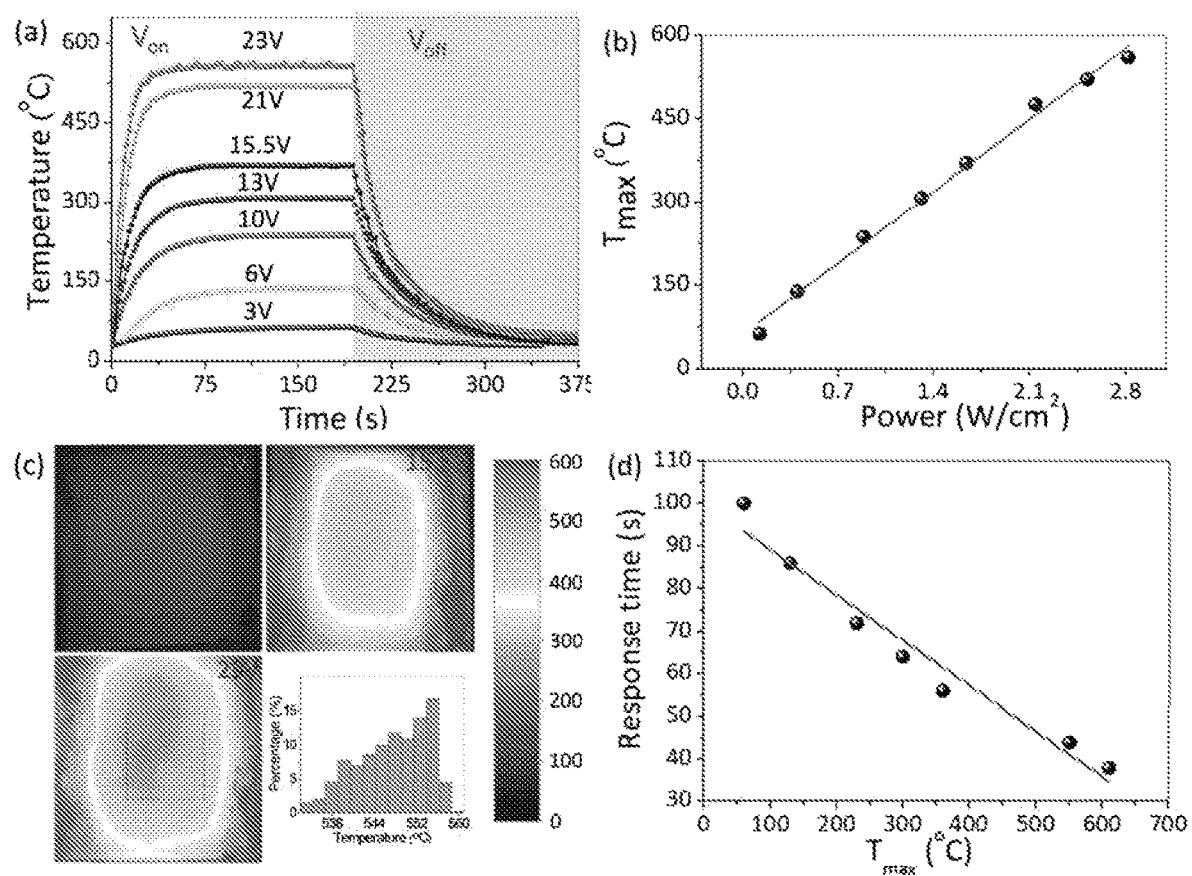

FIG. 21: High temperature transparent heater: (a) Temperature profiles of AuCP/quartz as a function of time at different applied voltages recorded using an IR camera. Here, Ag epoxy is used for making contact with AuCP. (b) Maximum temperature reached as a function of input power density. (c) IR images of AuCP/quartz (~Au thickness, 60 nm) at 3, 15.5 and 23 V along with a histogram of the temperature distribution in the marked area. Maximum temperature reached with 23 V, is ~550° C. and the distribution is narrow within ~30° C. range. (d) Temperature achieved against the response time for AuCP/quartz.

Figure 22:
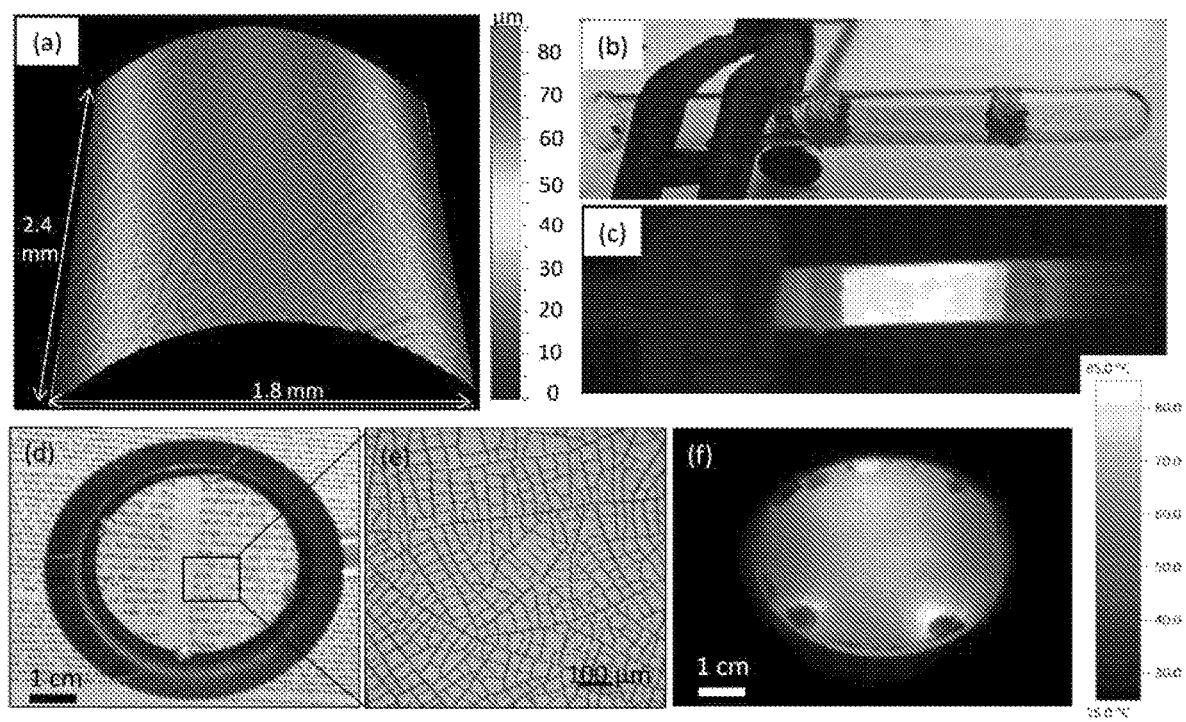

FIG. 22: (a) An optical profilometric image, (b) photograph of the tube (diameter 10 mm) coated with AgCP pattern and corresponding (c) thermal image taken at 20V showing uniform heating. (d) A convex lens (diameter 30 mm) coated with Ag CP pattern showing the magnifying action without obstructing the visibility (e) optical photograph showing the crackle network with corresponding (f) thermal image with 8 V applied voltage.

Figure 23:
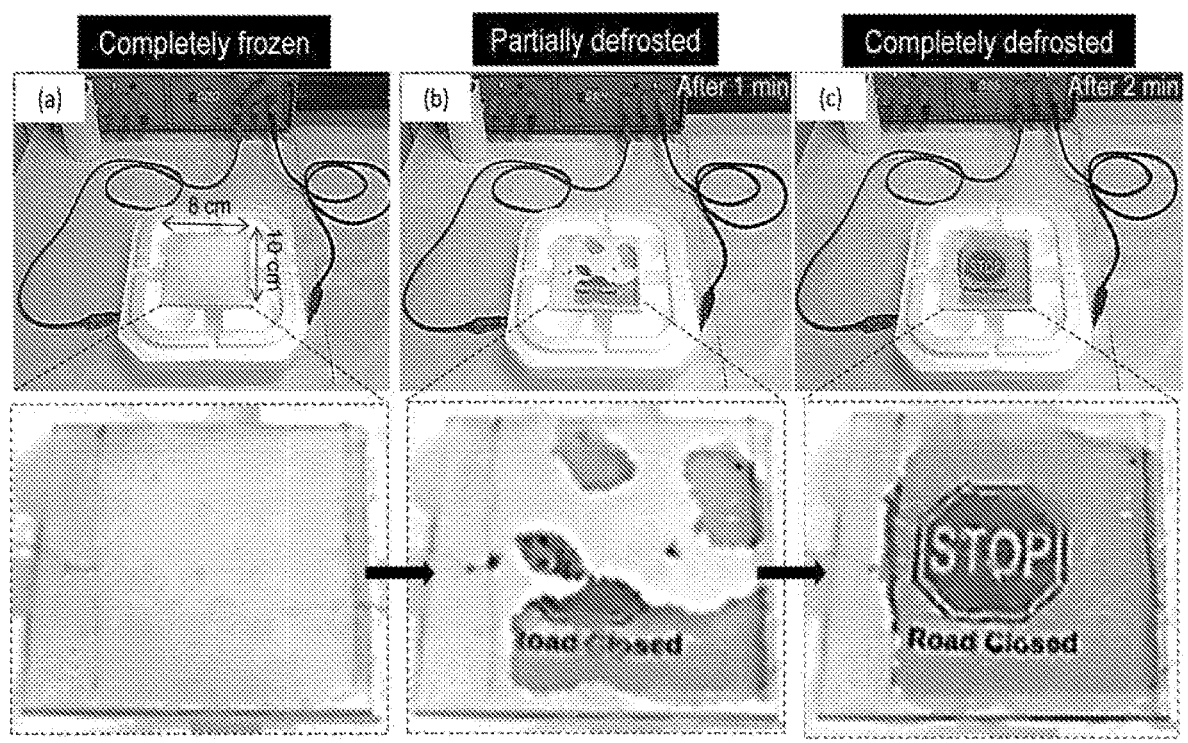

FIG. 23: Photographs of AgCP/glass derived defrosting window, (a) the frozen ice when exposed to liquid nitrogen with no heating. Upon application of 8.5 V bias, the joule heat begins to melt frost and makes the window transparent. (b) Partially defrosted window and (c) completely defrosted window.

Figure 24:
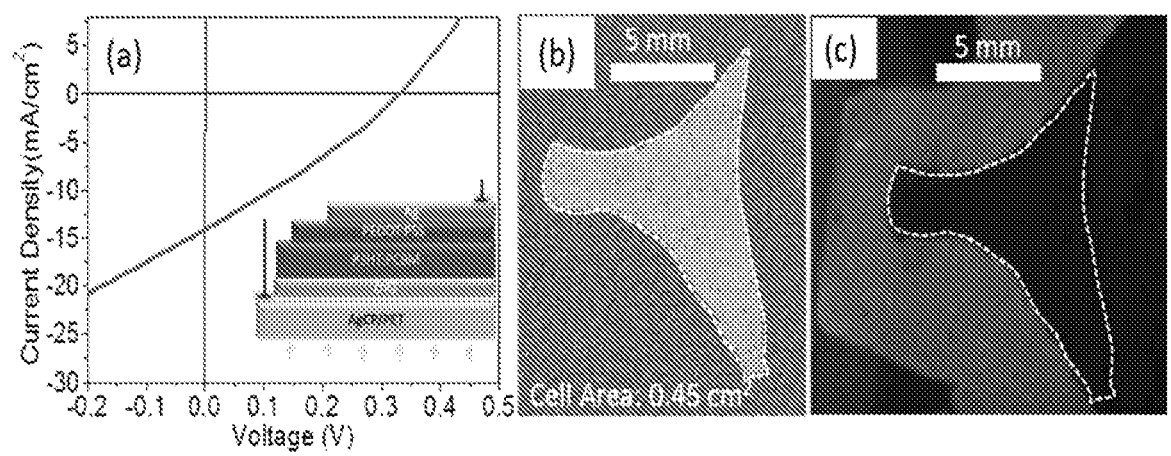

FIG. 24: (a) J-V characteristics of AgCP/PET as a transparent conducting electrode, inset shows the schematic illustration of solar cell. (b) Laser beam induced current (LBIC) mapping of the solar cell, marked area represents the active area. (c) Photograph of the polymer solar cell corresponding to LBIC mapping.

Figure 25:
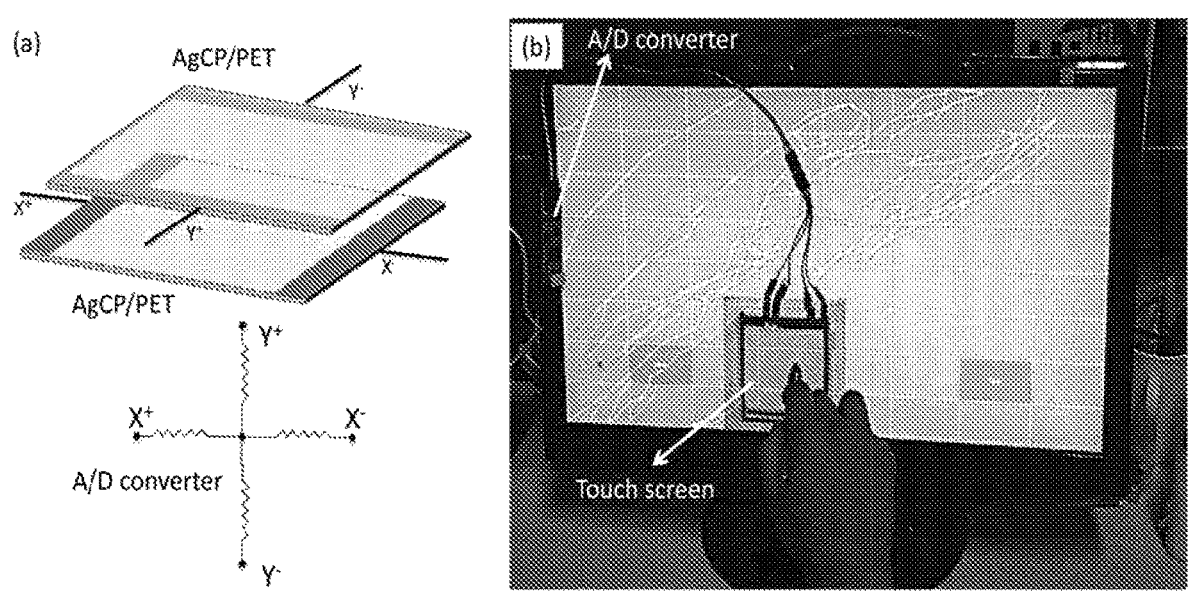

FIG. 25: (a) Schematic demonstrates the fabrication of touchscreen. (b) A photograph of a working prototype touchscreen display. Two AgCP/PET electrodes arranged in capacitor geometry are connected to a USB port of a computer through an A/D convertor. Writing on the transparent electrode produced signal for the computer display, thus demonstrating touchscreen application.

Figure 26:
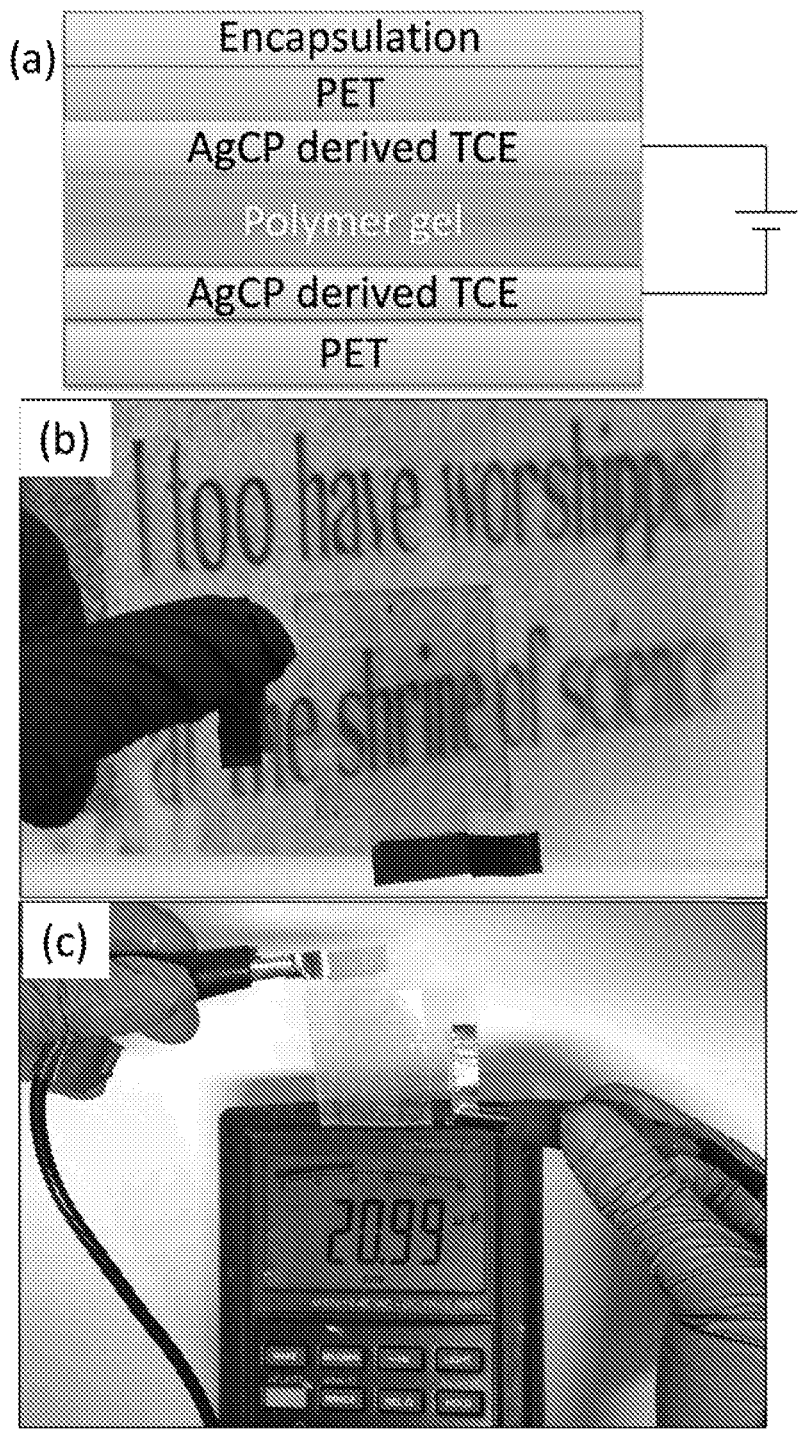

FIG. 26: (a) Schematic illustration of a transparent capacitor, photographs of (b) transparent capacitor displaying background information, (c) transparent capacitor connected to multimeter, displaying capacitance.

Figure 27:
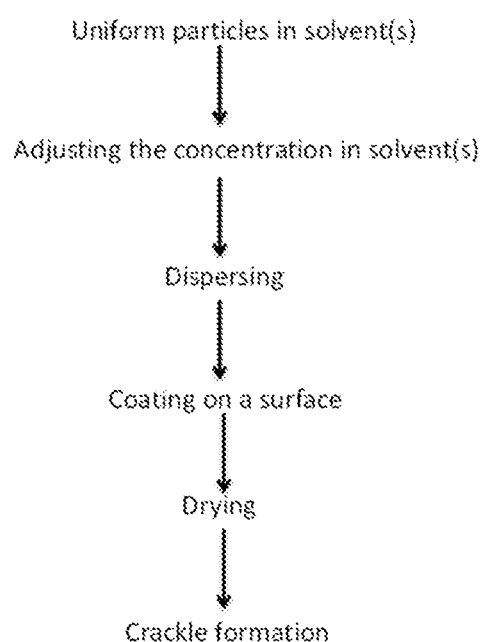

FIG. 27: Depicts a flow chart of the method of crackle formation using the composition of the present disclosure.

DETAILED DESCRIPTION OF THE DISCLOSURE

The present disclosure will now be described with reference to the specific embodiments of the disclosure.

All technical and scientific terms used herein have the same meaning as commonly understood by one of ordinary skill in the art to which this disclosure belongs.

Certain terminology used in the description of the disclosure herein is for describing particular embodiments only and is not intended to be limiting the scope of the disclosure.

All numbers expressing quantities of dimensions and volumes such as length, width, height, thickness and so forth as used in the specification are used for explaining the embodiments and are not intended to be limiting the scope of the disclosure.

Accordingly, the numerical properties set forth in the specification are approximations that may vary depending on the desired properties sought to be obtained in embodiments of the present disclosure.

The present disclosure relates to a composition for obtaining a film on a substrate, said composition comprising colloidal matter in solvent, wherein the colloidal matter has size ranging from about 10 nm to about 150 nm; and wherein the colloidal matter in the solvent is in concentration ranging from about 0.05 g/mL to about 2 g/mL.

In an embodiment of the present disclosure, the colloidal matter is selected from a group comprising acrylic resin nanoparticles, titanium dioxide, potassium-tetraoctylammonium bromide, palladium benzyl thiolate, palladium hexadecyl thiolate coffee powder and colloidal nanoparticles of other substances or any combination thereof.

In another embodiment of the present disclosure, the solvent is selected from a group comprising water, toluene, acetone, chloroform, ethyl alcohol, isopropyl alcohol, ethyl acetate, butyl acetate and methanol or any combination thereof.

In yet another embodiment of the present disclosure, the film is a crackled film obtained by drying of the composition without use of external stimuli.

The present disclosure also relates to a method of obtaining a composition as above, said method comprising act of combining colloidal matter of uniform size in solvent at concentration ranging from about 0.05 g/mL to about 2 g/mL to obtain the composition.

In an embodiment of the present disclosure, the uniform size is obtained by agitation followed by filtration of the composition.

The present disclosure also relates to a substrate having a film obtained by exposure of the substrate to a composition as above.

In an embodiment of the present disclosure, the substrate is selected from a group comprising transparent, translucent and opaque material having flexible substrate surface, rigid substrate surface, rough substrate surface or smooth substrate surface; and wherein the flexible substrate is selected from a group comprising PET, leather and petal of a flower; and wherein the rigid substrate is selected from a group comprising mica, quartz, Al plate, ceramic, wood, stainless steel and stone; and wherein the rough substrate is selected from a group comprising unpolished Silicon and paper; and wherein smooth substrate is selected from a group comprising silicon, glass and mica.

In another embodiment of the present disclosure, the film is a crackled film obtained by drying of the composition without use of external stimuli; and wherein crackles in the film are interconnected to form a single network.

In yet another embodiment of the present disclosure, the crackled film forms template for depositing the substrate with material or energy input to form a patterned substrate; wherein the material is selected from a group comprising conductor, semiconductor, insulator and dielectric or any combination thereof; and wherein the energy input is selected from a group comprising electron beam, ion beam, proton flux, light, UV irradiation and IR irradiation or any combination thereof.

The present disclosure also relates to a method of preparing a substrate having a film as above, said method comprising act of exposing surface of the substrate to a composition as above to prepare the substrate having the film.

In an embodiment of the present disclosure, the exposing is carried out by techniques selected from a group comprising drop coating, spin coating, rod coating, roll-to-roll coating and spray coating or any combination thereof.

In another embodiment of the present disclosure, the film is a crackled film obtained by drying of the composition without use of external stimuli.

In yet another embodiment of the present disclosure, the drying is carried out by techniques selected from a group comprising self-evaporation, light exposure, IR radiation, heating, spinning, rotating and cooling; and at temperature ranging from about 200K to about 360K. The present disclosure also relates to a patterned substrate fabricated with a substrate having a material or energy input deposited in template formed by crackling of a film on surface of the substrate.

In an embodiment of the present disclosure, the film is obtained by exposure of the surface of the substrate to composition as above.

In another embodiment of the present disclosure, the material is selected from a group comprising conductor, semiconductor, insulator and dielectric or any combination thereof; and wherein the energy input is selected from a group comprising electron beam, ion beam, proton flux, light, UV irradiation and IR irradiation or any combination thereof.

In yet another embodiment of the present disclosure, the patterned substrate is a device or part of a device.

In still another embodiment of the present disclosure, the device is selected from a group comprising conducting electrode, transparent conducting electrode, flexible transparent conducting electrode, heater, transparent heater, flexible transparent heater, solar cell, transparent solar cell, superconductor, transparent superconductor, transparent magnets, transistor, capacitor, transparent capacitor, display, transparent EMI shielding, electrochromic, thermochromic, stretchable electrodes, transparent strain sensor, transparent photo detectors, touch-screen, self-cleaning, super hydrophobic surface and micro channel based microfluidics or any combination thereof.

The present disclosure also relates to a method of fabricating a patterned substrate as above, said method comprising acts of:
a) exposing surface of substrate to a composition as above to obtain substrate having a film;
b) drying the substrate having the film to obtain crackled film on the substrate; and
c) depositing material or energy input in template formed by crackling of film on the surface of the substrate followed by optionally removing the film to fabricate the patterned substrate.

In an embodiment of the present disclosure, the drying is carried out by techniques selected from a group comprising self-evaporation, light exposure, IR radiation, heating, spinning, rotating and cooling; and at temperature ranging from about 200K to about 360K.

In another embodiment of the present disclosure, the depositing of material or energy input is carried out by techniques selected from a group comprising vacuum evaporation, sputtering, entire solution process, physical seeding assisted solution processing, substrate assisted solution process, light induced solution process and heat induced solution process or any combination thereof.

In yet another embodiment of the present disclosure, the material is selected from a group comprising conducting material, semiconducting material, insulating material and dielectric material or any combination thereof; and wherein the energy input is selected from a group comprising electron beam, ion beam, proton flux, light, UV irradiation, IR irradiation or any combination thereof.

In still another embodiment of the present disclosure, the removing of the film is carried out by techniques selected from a group comprising solvent assisted, mechanical force assisted and peeling by adhesive force or any combination thereof.

The present disclosure also relates to use of a patterned substrate as above in fabricating a device, wherein the patterned substrate is connected to a device for application in electronics.

The present disclosure also relates to a kit for obtaining a composition as above, a substrate as above or a patterned substrate as above; said kit comprising components selected from a group comprising colloidal matter, solvent, optionally a substrate, material or energy input and an instruction manual or any combination thereof.

The present disclosure provides compositions of various materials, which are tested for crackling to aid the patterning of substrates with metal wires of the order of micrometer and submicrometer. The patterning is done even on large areas of dimension, 155×102 cm$^2$ area. The patterned materials are found to be of great promise to substitute the commonly used oxides in the field of electronics; the details of which are given in the Examples below.

In an embodiment, the compositions detailed in the present disclosure are colloidal matter of the size ranging from about 10 nm to about 100 nm with a suitable solvent. The colloidal matter can be of any material, which can form colloidal particles of the size of 10 nm to about 100 nm with a suitable solvent. The said compositions crackle as U-shaped grooves without disruption in the connectivity (interconnected) into a single network on the surface of substrates including large surface areas. Thus, the crackle network serves as an efficient template for deposition of suitable materials by physical or chemical methods.

In another embodiment of the present disclosure, another advantage noted with the said composition is that they crackle spontaneously without induction of any external stimuli. It is understood that when a composition comprising of colloidal compounds and solvent(s) is coated as a film of suitable thickness, the solvent(s) evaporation causes a normal stress in the film through interfacial tension which translates to a transverse tensile stress in the plane of the film. As the tensile stress increases, a crack is induced and if the film-substrate interaction is minimal, a crackle results with no residual layer (at the bottom of the crack). The film is relieved of the fast evaporating solvent in the crackle region. The evaporation front causes microfluidic channels to form a network of interconnected crackles propagating the whole area of the evaporating film on the substrate.

In yet another embodiment, typically, the method of formation of crackles using the composition of the present disclosure is given in FIG. 27.

In still another embodiment of the present disclosure, the nature of crackle network depends crucially on the layer thickness and also on the shape, hardness and uniformity of the colloidal particles. Hard particles are found to produce broad crackles, while a solution containing soft particles do not crack at all (K. B. Singh et al; *Phys. Rev. Lett.* 98, 218302-218304, 2007). Different compositions comprising colloidal matter of various substances selected from a group comprising acrylic resin nanoparticles, titanium dioxide, potassium-tetraoctylammonium bromide, Palladium benzyl thiolate, Palladium hexadecyl thiolate in solvents and coffee powder extracted from decoction in different solvents are chosen for analysis to exemplify the capacity to crackle to the desired extent. Therefore, the instant disclosure enables 7 different compositions for testing crackle lithography on varied substrates. However, the instant disclosure by way of providing such compositions is not to be construed to be limited only to the said 7 compositions. A person skilled in the art will be able to envisage and extend the concept of the instant disclosure to other similar compositions. Hence the instant disclosure encompasses all such similar compositions which can be arrived at, by carrying out minute changes to the compositions disclosed in the instant disclosure.

In still another embodiment of the present disclosure, solvent selected from a group comprising water, toluene, acetone, chloroform, ethyl alcohol, isopropyl alcohol, ethyl acetate, butyl acetate and methanol or mixture thereof, are employed in the preparation of compositions for the formation of crackles. The organic solvent is selected from a group comprising ethyl acetate, acetone, ethyl alcohol, isopropyl alcohol and the like.

In still embodiment of the present disclosure, the crackle patterns are formed on various substrates, which can be either flexible or rigid substrates selected from a group comprising mica, quartz, PET, unpolished Silicon, Al plate, ceramic, wood, stainless steel, paper, leather, stone and petal of a flower.

In still another embodiment of the present disclosure, the crackle patterns are formed spontaneously even on highly rough surfaces such as paper (roughness~1 μm) and unpolished Silicon (roughness~0.7 μm) without any external stimuli. This demonstrates the potential of crackle patterning on any substrate.

The present disclosure further relates to a process/method for patterning of substrates with materials/energy inputs by crackle lithography which involves the following general steps. Firstly, a clean substrate is taken. Thereafter, a crackle forming composition (any of compositions 1-7) is prepared which comprises components/substances (colloidal matter) in uniform particle size or components/substances obtained in uniform particle size by subjecting the components/substances to agitation. Uniformity of the particles is further maintained by filtering the solution and SEM imaging is carried out to check the uniformity of particles. Said composition is further diluted with suitable solvents of appropriate concentration. Said composition exposed to the substrate or is coated as a thin film on the substrate. Spontaneously interconnected crackles get formed after solvent evaporation or drying from one end of the substrate to other end in the form of a continuous network as a template. Drying is carried out by techniques such as self-evaporation, light exposure, IR radiation, heating, spinning, rotating or cooling. Drying temperature ranges from about 220 K to about 353 K. In the second step, a desired material is deposited or an energy input is given into the template. Later, optionally the sacrificial film is removed using solvent(s). A network of interconnected wires of the deposited material is thus formed on the substrate.

In an embodiment of the present disclosure, width of the crackle patterns is easily controllable by changing the thickness of the sacrificial film by varying the concentration of the compositions. If the particulate in the composition decreases, the film thickness decreases and the said decrease leads to lesser surface energy therefore further leading to smaller crackle widths.

In another embodiment of the present disclosure, width of the crackle patterns and polygonal areas are controllable by varying drying temperatures during the process. The crackle widths as well as the polygon areas are found to decrease for crackle compositions, at lower drying temperatures due to slower evaporation of solvents, which obviously influence the stress release in the film.

In yet another embodiment of the present disclosure, width of the crackle patterns and polygonal size are controllable by varying solvent volume. In general, increasing volume of the dispersion for coating or increasing the volume of solvent on dilution decreases the crack width and the polygonal size.

In still another embodiment of the present disclosure, density of crackle patterns is controlled by spin coating speed. Crack patterns formed at higher spinning speed have higher density of crackles, because of faster evaporation rates.

In still another embodiment of the present disclosure, crackle pattern is fabricated over areas with different length scale by various coating techniques selected from a group comprising drop coating, spin coating, rod coating, and roll-to-roll spray coating. Drop coating, spin coating and rod coating techniques are limited by the area while roll coating and spray coating can be extended for large area fabrication.

In still another embodiment of the present disclosure, it is observed that the direction of the crackle formation can be aligned/controlled by controlling the direction of the flow of the solution comprising the composition of the instant disclosure.

The present disclosure also relates to devices fabricated with patterned substrates, wherein the devices are selected from a group comprising conductor, electrodes, heater, transparent heater, solar cell, transparent solar cell, superconductor, transistor, capacitor, transparent capacitor, display, transparent EMI shielding, electrochromic, thermochromic, touch screen, self-cleaning, super hydrophobic surfaces, microchannels and the like.

The present disclosure typically provides a low cost, three step method to produce large area devices using crackle lithography. It makes use of eco-friendly solvents, commonly available substrates like glass and PET with cheap sacrificial layer and simple metal deposition system.

In an embodiment of the present disclosure, the sacrificial layer is vacuum compatible.

Yet another embodiment of the present disclosure includes a kit comprising composition to form crackle template, material(s) for deposition in the crackle template and solvents to optionally remove the template film to obtain patterned substrate for fabricating various devices such as conducting electrode, transparent conducting electrode, heater, transparent heater, solar cell, transparent solar cell, superconductor, transparent superconductor, transparent magnets, transistor, capacitor, transparent capacitor, display, transparent EMI shielding, electrochromic, thermochromic, stretchable electrodes, transparent strain sensor, transparent photo detectors, touch-screen, self-cleaning, super hydrophobic surface, micro channel based microfluidics.

A more complete understanding can be obtained by reference to the following specific examples, which are provided for purposes of illustration only and are not intended to limit the scope of the disclosure. These examples form part of the detailed description of the instant disclosure.

EXAMPLES

Acronyms

ITO=Indium tin oxide
PEDOT=Poly(3,4-ethylenedioxythiophene)
$R_s$=Sheet resistance
TCE=transparent conducting electrode
SEM=Scanning electron microscope
AFM=Atomic force microscope
MCP=Material in crackle patterns
PET=Polyethylene terephthalate
EDS=Energy-dispersive X-ray spectroscopy

Example 1

Preparation of Compositions and Methods Employed for Crackle Lithography

Composition-1:

An example chosen for studying the crackle formation is Acrylic resin. Acrylic resin nanoparticle based commercially available nail polish and diluter (Ming Ni Cosmetics Co., Guangzhou, China) is used as a source for a crackle forming composition. The acrylic resin nanoparticles are dispersed in water/diluter (0.3 g/mL to about 1 g/mL) and rigorously ultrasonicated for 30 min before filtering using Whatman filter (1 μm GF/Bw/GMF). The filtrate is left overnight in an air-tight bottle. The suspended solution containing uniformly sized particles is extracted as needed and used as a crackle forming composition-1. The final solution is diluted with water/diluter and the concentration is adjusted.

Composition-2:

Another example chosen for studying the crackle formation is $TiO_2$. Typically P25 $TiO_2$ is dispersed in ethanol (0.05 g/mL to 0.1 g/mL) and ultrasonicated for 30 min. Later, the solution is allowed to settle for 15 min. The suspended solution containing uniformly sized particles, is collected without disturbing the bottom layer. A 50 μL of the suspended solution is drop coated over 1 $cm^2$ area glass substrate. After spontaneous drying of crackle precursor the crackle networks are formed as shown in FIG. 2(a). A Crackle width is tuned by controlling the concentration of $TiO_2$ dispersion in ethanol.

Composition-3:

Another example chosen for studying the crackle formation is Pd benzyl thiolate. A one month aged 0.25 M Pd benzyl thiolate in toluene is rigorously ultrasonicated for 30 min and filtered. A 100 μl solution of is spin coated on glass substrate at 6000 rpm for 30 s. As shown in the FIG. 2(b), the crackle patterns are formed throughout the substrate.

Composition-4:

Another example chosen for studying the crackle formation is Pt-ToABr. Pt-ToABr solution is prepared by phase transferring 50 mM $K_2PtCl_4$ from aqueous to toluene phase using ToABr as phase transfer reagent. A 50 μL solution is spin coated at 1000 rpm for 60 s on Si substrate over 1 $cm^2$ area. The optical microscope image of the formed crackles on silicon substrate is shown in FIG. 2(c).

Composition-5:

Another example chosen for studying the crackle formation is Coffee powder. A 200 g of coffee powder from Cothas coffee Co., Bangalore, India is added with 1 L of water and boiled in electric kettle for 10 min while stirring and left undisturbed for 2 h. The formed coffee decoction is separated out through filter. The filtered decoction solution is placed inside hot air oven, which is maintained at 90° C. When the volume is reduced to 600 mL, the decoction is filtered through 200 nm pore sized Whatmann filter paper to obtain uniformly sized particles. The filtered solution is again concentrated to 3 times by evaporation inside hot air oven. The final solution is drop coated over clean glass or Si substrate and water evaporation is facilitated through vacuum pump. After drying, interconnected crackles are formed as shown in FIG. 2(d).

Composition-6:

Another example chosen for studying the crackle formation is $SiO_2$ paint. $SiO_2$ based crackled paint is dispersed with commercially available diluter (0.15 g/mL to 1.5 g/mL) and ultrasonicated for 15 min (Premium Coatings and Chemicals (P) Ltd, India) to obtain uniformly sized particles. Thus, formed dispersion of 2 mL is drop coated over 1 $cm^2$ area glass substrate. After drying the crackle networks are formed as shown in FIG. 2(e).

Composition-7:

Another example chosen for studying the crackle formation is Ag ink. Conducting silver ink from Kunshan Hisense Electronics CO., LTD is diluted to 3 times with isopropyl alcohol and filtered through 200 nm pore size filter from Millipore Millex-FG and ultrasonicated for 15 min to obtain uniformly sized particles. A 50 µL of the solution is drop coated over 1 $cm^2$ area glass substrate and dried under 60 W sodium light overnight. Optical microscope image of the as-formed crackles are shown in FIG. 2(f).

The crackle networks are formed with Acrylic resin, $TiO_2$, $SiO_2$ and coffee power nanoparticles, as well as with Pd benzylthiolate, Pt-ToABr solution and Silver Ink Thus, the crackle patterns are formed with uniformly dispersed nanoparticles and controlled with solvent concentration.

a film, wherein the film is a crackled film obtained post drying of the composition. In the second step, a desired material is deposited or an energy input such as radiation is given (see FIG. 1(c)). The sacrificial film is then removed in solvent(s), thus forming a patterned substrate. As shown in FIG. 1(d), a network of interconnected wires of the deposited material or features is formed throughout the substrate.

All the following methodologies and observations are carried out with specific compositions as indicated in the Examples. FIG. 27 provides a flow chart of the method for crackle preparation using any composition prepared as per the present disclosure. But nonetheless, the specific compositions (any one of the 7 compositions) are employed only for the purpose of workability and are not to be construed to limit the applicability of these compositions to the said methods alone. The specific compositions are employed in the Examples below only to reduce the undue burden on the part of the Applicant to show workability of all the compositions (1-7). Hence any person skilled in the art or any person of average skill in the art will be able to employ all the compositions of the instant disclosure to all the examples mentioned henceforth. Therefore, it is to be construed that all the compositions (1-7 compositions) mentioned in the instant disclosure and any compositions of similar nature to be equally workable for all the parameters mentioned in the following Examples 3-14.

Example 3

Crackling of Film on Surface of Substrates (Composition 1) and Observation of Results The composition 1 is prepared as detailed in the example 1 above. Thereafter, the crackle patterns are formed after spin coating about 50 µL solution of about 0.7 g/mL of

TABLE 1

Table listing the crackle composition

| S. No. | Content of composition | Source | Name | Relevant FIGS. |
|---|---|---|---|---|
| 1. | Acrylic resin nanoparticles | Ming Ni Cosmetics Co., Guangzhou, China | Composition-1 | 3, 4, 5, 8 (b, c, e and f), 9a, 10 to 22 |
| 2. | $TiO_2$ nanoparticles | Sigma-Aldrich, US | Composition-2 | 2a, 6, 7, 8d, 25 |
| 3. | $SiO_2$ nanoparticles | Premium Coatings and Chemicals (P) Ltd, India | Composition-6 | 2e, 9b and 23 |
| 4. | Pd benzylthiolate | Sigma-Aldrich, US | Composition-3 | 2b |
| 5. | Pt- ToABr | Sigma-Aldrich, US | Composition-4 | 2c |
| 6. | Silver ink | Kunshan Hisense Electronics CO., LTD, China | Composition-7 | 2f |
| 7. | coffee powder | Cothas coffee Co., India | Composition-5 | 2d |

Example 2

General Methodology/Process for Patterning of Substrates

FIG. 1 illustrates the general process/method by employing all the 7 compositions for depositing of patterned substrate with materials/energy inputs by crackle lithography of the instant disclosure. As shown in FIG. 1(a), a clean substrate is taken. A crackle forming composition (any of 1-7) in solution form is coated on the substrate as a thin film. After solvent evaporation, spontaneously interconnected crackles get formed from one end of the substrate to other end as shown in FIG. 1(b), thus forming a substrate having crackle forming composition comprising acrylic resin nanoparticles (Composition 1) dispersions on a glass substrate at about 3000 rpm. As given in the FIG. 4(a), the optical micrograph shows the presence of randomly distributed crackles. A magnified view of the optical micrograph reveals the interconnectivity between the crackles (FIG. 4(b)). Further, AFM topography image of the crackle patterns demonstrates that the opening of the crackles and its width varies from 1-3 µm (FIG. 4(c)). The height profile in the FIG. 4(d) shows that the crack is down to the substrate (essentially forming a crackle). The crackles appear as U-shaped grooves (FIG. 4(e)), importantly, with no residual layer at the bottom, which is crucial for lithography. In order to understand the crackle patterns, the fractal analysis is performed. As shown in FIG. 4(f), the perimeter and area of each polygon in FIG. 4(a) are plotted in double logarithm scale. The fractal dimension (D) determined from the slope is found to be approximately 1.12, indicating the crackles are like straight lines, forming polygonal domains. Moreover, the fractal dimension calculated from 10 different areas are varied from, D=1.12 to 1.18, demonstrating the uniformity in crackling patterns.

Example 4

Correlation of Composition Concentration with Width of Crackle Patterns (Composition 1 and 6)

The width of the crackle patterns is easily controllable by changing the thickness of the sacrificial film FIG. 5 shows the optical micrographs of the crackle patterns formed with crackle forming composition-1, about 1 g/ml, about 0.5 g/mL, about 0.36 g/mL and about 0.3 g/mL concentration in water and the crackle widths are approximately 200 µm (FIG. 5Aa), 60 µm (FIG. 5Ab), 10 µm (FIG. 5Ac) and 0.5 µm (FIG. 5Ad), respectively. It is understood that as the concentration of the particulate in the composition decreases, the film thickness decreases and the said decrease leads to lesser surface energy therefore further leading to smaller crackle widths. It is also found that the crackles formed with solutions by varying the concentrations are clear and down to the substrate, which is essential for the fabrication of a network. In order to control the density of crackles, the spin coating is performed at different speeds. The crackle patterns are formed on glass by spin coating about 50 µL crackle forming composition-1 of about 0.7 g/mL solution in water. The optical micrographs of formed crackle patterns by spin coating at about 1000 and about 6000 rpm are shown in the FIGS. 5A(e) and 5A(f), respectively. Interestingly, the crack patterns formed at higher spinning speed has higher density of crackles, because of faster evaporation rates. Hence, the crackle patterns density is controlled by the spin coating speed. A second layer of crackle patterns are fabricated on the first layer of crackle patterns as shown in FIG. 5A(g). Following the same processor a third layer of crackle patterns are fabricated on second layer (see FIG. 5A(h)). Hence, this demonstrates the possibility of hierarchical patterning with crackles.

The crack width and spacing in the template are variables; they depend on the thickness of the drying layer. In the present disclosure, no well-defined cracks are seen for thicknesses up to 700 nm and 30 µm, which is the critical thickness for crackle forming composition-1 and crackle forming composition-6, respectively. With increase in the layer thickness, both the crackle width and spacing (cell side) increased linearly (FIG. 5B). Importantly above the critical layer thickness, the crackle interconnectivity is always to be found.

Example 5

Correlation of Temperature with Width of Crackle Patterns (Composition 2)

The crackle widths as well as the polygon areas are found to decrease for crackle composition-2, at lower drying temperature (compare FIGS. 6(a) and (b)) due to slower evaporation of the solvents, which obviously influences the stress release in the film. The maximum crackle width decreased from 37 µm at 328 K to 18 µm at 258 K and the variation is nearly linear with some spread (FIG. 6(c)). Concomitantly, the average area per polygon, calculated by dividing the total area (~2.4 mm$^2$) with the number of polygons, is also found to vary linearly (FIG. 6(d)). Below 258 K, drying the nanoparticle film proved practically difficult.

Example 6

Correlation of Solvent Volume with Width of Crackle Patterns (Composition 2)

The optimization of crackle forming composition-2 is carried out by altering the volumes of solvents used. The volume ratio of ethyl acetate (EtAc) and ethanol (EtOH) and the volume of nanoparticle dispersion used for controlling film thickness, have been varied. In the absence of ethyl acetate, the TiO$_2$ nanoparticle dispersion in ethanol (0.08 g/mL) produced polygons that re relatively large, while addition of 0.3 mL to the dispersion made cracks less interconnected (FIG. 7). In general, increasing volume of the dispersion for coating increased crack width and the polygonal size. A coating obtained with 70 µl of the dispersion containing 0.16 mL ethyl acetate, is found appropriate.

Example 7

Different Coating Techniques Employed in Process/Method for Crackle Formation (Composition 1 and 2)

FIG. 8 shows that the crackle pattern can be fabricated over areas with different length scale by various techniques such as drop coating, spin coating, rod coating, or roll-to-roll spray coating. Drop coating, spin coating and rod coating techniques are limited by the area while roll coating, spray coating can be extended for large area fabrication.

Example 8

Formation of Crackle Patterns (Composition 1 and Composition 3)

FIG. 9(a) shows the crackle patterns forming using crackle composition-1, made on a large sheet of PET (area, 20×15 cm$^2$). The uniform colour contrast indicates the uniformity of the crackle patterns in a large area without any gaps. In order to demonstrate the interconnectivity of the crackles, optical micrographs are taken randomly at different places on the substrate (black dots in FIG. 9(a)). The optical micrographs at six different places, arranged around the digital picture, reveal the uniformity of the crackle patterns in all the places. In addition, it is demonstrates that all the crackles are down to the substrate and interconnected without any breaks, crucial for making large area networked pattern. The crackle patterns are easily formed on large area of about a meter square with a high degree of uniformity. The crackle forming composition-3 is drop coated over 155×102 cm$^2$ area using paintbrush (see FIG. 9(b)). After drying, the crackle networks are formed all over substrate.

Example 9

Fabrication of Crackle Template as Linear Gratings with Various Composition Concentrations (Composition 1)

Crackle template is fabricated as linear gratings. FIG. 10(a) illustrates the formation of linear patterns with crackle forming composition-1. The substrate is place at angle (30°) to the horizontal line at 80° C., and the crackle forming composition is drop coated as shown in the FIG. 10(a). After solvent evaporation, the linear gratings formed spontaneously as shown in FIG. 10(b). The linear gratings spacing and line widths are tuned by changing the concentration (see FIG. 10(c)). The Table-2 shows the optimization of linear gratings with various concentrations. These line patterns can also be obtained by confinement induced crackling with external boundaries.

TABLE 2

Linear gratings with various concentrations

| S. No. | Concentration of crackle forming composition -1 mg/ml water | Crack width | Crack depth | Crack period |
| --- | --- | --- | --- | --- |
| 1. | 150 | 2.6 µm | 4.4 µm | 13.4 µm |
| 2. | 75 | 1.4 µm | 2.93 µm | 12.58 µm |
| 3. | 37.5 | 1.5 µm | 3.58 µm | 10.9 µm |

After deposition of material and lift-off, the patterned material is referred as Material in Crackle Pattern (MCP). In the present disclosure crackles of varying widths produced by controlling the thickness of the crackle layer, by design, can be translated to the MCP itself. Network of active materials, is invisible to the naked eye, and is realized on aforementioned substrates by physical and chemical methods of deposition.

Example 10

Effectiveness of Crackled Layer as Template in Lithography (for Single Metals), Composition 1

The effectiveness of the crackled layer as a template in lithography is demonstrated by vacuum depositing Au (100 nm thick) as an example. Following lift-off in chloroform produced an interconnected Au wire network on glass (FIG. 11(b)), briefly AuCP/glass. From the AFM topography images, it is observed that the Au wire network (FIG. 11(b)) appears very similar to the crackle pattern (FIG. 11(a)). For instance, the small notches formed in the crackle pattern denoted by '1' and '2' in FIG. 11(a), are seen neatly replicated in the Au network (FIG. 11(b)) along with a narrow crackle (~900 nm) marked as '3'. If the two images are overlaid (see FIG. 11(c)), it becomes apparent that the AuCP simply mimics the CP itself with no residual implying a successful lift-off. The width of the metal wire measured from a region is similar to the local crackle width (FIG. 11(d)). Further, the 2D fill factor associated with the Au network is only ~15%. An AuCP/PET is fabricated over a PET area of 15×20 cm² by rod coating the crackle forming composition-1 (see FIG. 9(a)), followed by Au deposition and lift-off. The photograph in FIG. 11(e) demonstrates the transparency of the AuCP/PET. The optical micrographs surrounding the photograph in FIG. 11(e), are chosen randomly from different parts of the TCE to show the uniform spread of the Au wire network. The Au fill factor is found to vary in a narrow range, 16.2 to 17.8%. Importantly, the AuCP/PET fabrication by crackle lithography need not restrict to cm² areas; with proper coating and deposition arrangements, over ultra-large areas can be realized without comprising uniformity in parameters.

Example 11

Effectiveness of Crackled Layer as Template in Lithography (for Hybrid Electrodes)

Besides single metals, crackle lithography opens up many possibilities of forming hybrid electrodes. As an example shown in FIG. 12, a crackle pattern on PET is deposited with Cu first (thickness, ~160 nm) followed by Au (~100 nm) to result in Au-CuCP/PET electrode. This way a cheaper metal network, such as Cu, can be used as an electrical backbone while the top metal (Au) provides the desired surface Submitted passivation, work function tunability etc. in a device. Hence, the hybrid structures are fabricated using crackle lithography, which can be extended to triple metal and more number of layers.

Example 12

Process for Deposition of Materials/Energy Inputs (Composition 1 and 3)

In the present disclosure, the material is deposited by solution process. Selective deposition of Cu in the crackle regions is achieved by first depositing Pd crackle template (FIG. 13a). The crackle templates formed using crackle forming composition-1 and composition-3 are dosed with Pd by dipping the substrate carrying the crackle template in $PdCl_2$ solution (3 mM in ethylene glycol) and heating to 120° C. for 30 min to nucleate Pd catalyst particles. Alternatively, Pd in vacuum evaporation is also used for seeding the catalyst particles. The crackle layer is then washed away either with chloroform or acetone to leave catalyst particles in the crackle network pattern on the substrate as shown in FIG. 13(d). This is followed by electroless and electroplating deposition of Cu to the desired thickness. The EDAX spectrum of the Cu-PdCP/PET is shown in FIG. 13(e). Hence, the MCP is fabricated using completely solution process and with evaporated Pd seed layer assisted deposition.

The MCP electrode developed in this study consists of a wire network, which is not only macroscopically extended, but is also nearly devoid of redundant wires by design. This unique nature of the electrode should enable selective electrochemical deposition of another material on the wire network in an efficient way, where the deposited layer serves as a charge separation layer or brings in desired surface properties such as work function. This aspect is demonstrated by electrochemically depositing ZnO on AgCP/PET. FIG. 14Aa shows a typical scanning electron microscopy (SEM) image of Ag conduits after ZnO deposition. The deposition is uniform, demonstrates the electrical connectivity of Ag conduits over 2×2 cm² area. The magnified view of ZnO (see FIG. 14A(b)) shows the porous structure of the deposited film. In order to find the uniformity and connectivity of the deposited ZnO/AgCP, EDS elemental mapping is performed in the same region. Ag and Zn elemental mapping is shown in FIGS. 14Ac and 14Ad respectively. The EDAX spectrum of AgCP and ZnOAgCP is shown in FIGS. 14A(e) and 14A(f). More interestingly, there is no signal of Ag from ZnO layer region (blow marked area), indicating the deposition is uniform throughout the Ag conduits. Moreover, Zn, O signal is limited to Ag conduits, demonstrates the electrically connected over a large area. The uniform ZnO deposition throughout the substrate (see FIG. 14A(a)) indicates uniform charge flow in the Ag conduits. Hence, the AgCP/PET derived Ag conduits are electrically well connected with each other without any contact resistance between the wires.

By employing a similar technique as above, in place of depositing materials, energy inputs selected from a group comprising electron beam, ion beam, proton flux, light, UV irradiation and IR irradiation or any combination thereof instead are employed for obtaining a patterned substrate which is deposited with the said energy inputs. Said patterned substrate is used as a device or attached to a device for application in electronics.

Process for Deposition of Materials/Energy Inputs (Composition 1 and 6)—

Selective deposition of Cu in the crackle regions is achieved by depositing Pd or Au catalyst particles over the dried template. As ultralow quantity of the noble metal catalyst is required for Cu deposition, the additional cost of catalyst per unit area of the substrate is rather low. Substrates are dosed with Pd by dipping the substrate carrying crackle template (formed with crackle forming Composition-1 and Composition-6) in PdCl2 solution (3 mM in ethylene glycol) and heated to 120° C. for 30 min to nucleate Pd catalyst particles. Alternatively, Au sputtering is also used for seeding the catalyst particles. Au sputtering is considered highly adoptable for roll-to-roll coating, unlike other physical methods. The crackle layer is then washed away with acetone (Composition-6) or chloroform (Composition-1) to leave catalyst particles in crackle network pattern on the substrate. This is followed by electroless and electroplating deposition of Cu to the desired thickness. The process of Cu deposition on Au seed particles in is illustrated in FIG. 14B. Both, electroplating and electroless depositions could be easily done on the patterned Au seed layer. For electroplating (FIG. 14Ba, left), the Au seed coated substrate is made the working electrode and a Cu plate as the counter electrode in a Cu plating bath containing copper sulphate (0.2 g/ml) and sulphuric acid (0.050 g/ml) solution and the thickness can be controlled by the deposition time and the applied voltage. For the electrode shown in FIGS. 14Bb and 14Bc, the deposition is carried out with an applied voltage of 0.6 V for 45 s to result in Cu network of ~300 nm thick. The Cu metal got deposited selectively on Au such that regions devoid of Au are kept clear to result in a transparent electrode (FIG. 14Bb). FIG. 14Bc shows a highly interconnected Cu network formed by electroplating. In electroless deposition, the Au network containing substrate is dipped in a plating bath (Copper A: formaldehyde, 10:1) for different time intervals without any external voltage and Cu networks of varying thicknesses are obtained (FIG. 14Ba, right). The photograph in FIG. 14Bd shows a transparent electrode obtained with electroless deposition with the network image in FIG. 14Be. The network formed is continuous and extends over a large area.

The crackle network obtained in crackle forming Composition-1 is replicated with a Pd seed layer (FIG. 14Bf) by thermal decomposition of PdCl2 dosed from solution and washing away the crackled layer with chloroform. The substrate is then dipped in electroless plating bath wherein uniform coverage of Cu took place to give rise to a Cu wire network as shown in FIG. 14Bf. A view of the substrate carrying the network (FIG. 14Bg) clearly shows its transparency to the visible light. The obtained TCEs are transferred from glass substrate to PDMS substrate. Thus, these metal networks can be transferred to desired substrates.

By employing a similar technique as above, in place of depositing materials, energy inputs selected from a group comprising electron beam, ion beam, proton flux, light UV irradiation and IR irradiation or any combination thereof instead are employed for obtaining a patterned substrate which is deposited with the said energy inputs. Said patterned substrate is used as a device or attached to a device for application in electronics.

Example 13

Formation of Crackle Template on Rough Substrate Surface (Composition 1)

In another embodiment of the present disclosure, the crackle template is formed on rough Si surface (roughness~700 nm) with crackle forming composition-1 as shown in FIG. 3(d). The substrate is dipped in electroless solution of Au for 30 s. After deposition of Au in the crackle, it is followed by lift-off A continuous Au network (AuCP/Si) is formed over 1.4×1.2 mm² area, as shown in SEM of FIG. 15A(a) and magnified view in FIG. 15A (b). The magnified view clearly demonstrates the interconnectivity between the Au wires. Hence, AuCP/Si is formed even on rough surfaces by solution process using crackle lithography.

In the present disclosure, the crackle patterns are formed on various substrates, which can be either flexible or rigid substrates. Optical micrographs of crack patterns formed on flexible and rigid surfaces like (a) mica, (b) quartz, (c) PET, (d) unpolished Silicon, (e) Al plate, (f) ceramic, (g) wood, (h) stainless steel, (i) paper, (j) leather, (k) stone and (l) petal of a flower is given in FIG. 3. The crackle patterns are formed spontaneously even on highly rough surfaces such as paper (roughness~1 µm) and unpolished Silicon (roughness~0.7 µm) without any external stimuli. This demonstrates the potential of crackle patterning on any substrate.

Formation of Crackle Template on Smooth Substrate Surface (Composition 1)

In order to corroborate the potential of crack lithography though solution process and on smooth surfaces, electroless deposition of Au with crackle patterned Si substrate (Roughness~1 nm) is attempted. FIG. 15B(a) shows the Au wires in network with widths in submicron range obtained after removing the sacrificial film. The magnified view (FIG. 15B(b)) shows the continuous network of Au wires with widths in the range of 300-700 nm. In few places, smaller (~300 nm width) wires are seen projecting into the polygonal domains; these could be vital for electrical connectivity of an active layer which may be deposited on TCE in a given device (see FIG. 15B(c)). The individual Au wires with widths in submicron range shown in FIG. 15B(d), reveal the high degree of connectivity among themselves. As demonstrated in this example, crack lithography may be employed without any elaborate instrumentation.

Example 14

Different Devices Fabricated with Patterned Substrates

1. Transparent Conducting Electrode (TCE)

As light transmission is determined by the optical properties of the insulating substrate, a substrate such as quartz, which is transparent from UV to IR, can offer as an interesting possibility. An AgCP/quartz (FIG. 16, blue curve), exhibited average T of 90.5% in a wide spectral range, 240 to 3000 nm (~82% in the UV region). This TCE shows a low sheet resistance value of 2.6 Ω/square. Further, the haze value of the AgCP/quartz is notably small, ~2 to 3% (magenta curve, FIG. 16).

Haze is calculated using the following equation, $H = \Delta T/T_{dif} \times 100$ Where $\Delta T = T_{dif} - T_{sp}$
$T_{dif}$=Diffusive transmittance
$T_{sp}$=Specular transmittance Likewise, several MCP derived TCEs (different metals on different substrates) are made as listed in Table-3.

TABLE 3 provides a list of the MCP derived on various substrates

| S. No. | MCP/substrate | Sheet resistance (Ω/square) | Specular transmittance at 550 nm (%) | Wire thickness (nm) |
|---|---|---|---|---|
| 1 | AgCP/glass | 2.1 | 83.7 | 110 |
| 2 | AgCP/quartz | 2.6 | 86.1 | 90 |
| 3 | AuCP/PET over 15 × 20 cm² area | 4.5 | 88 | 100 |
| 4 | AuCP/PET | 3.8 | 88.1 | 100 |
| 5 | AlCP/PET | 52.8 | 87.6 | 110 |
| 6 | CuCP/PET | 2.0 | 81.6 | 160 |
| 7 | ZnCP/glass | 12.2 | 82.4 | 240 |
| 8 | Au—CuCP/PET | 1.6 | 81.7 | 260 |
| 9 | Al—CuCP/PET | 2.2 | 82.6 | 220 |
| 10 | Cu—PdCP/PET | 3.2 | 78.1 | 720 |

While uniformity of a TCE in terms of transmittance can be directly evidenced, other parameters such as Rs, fill factor, surface roughness and chemical cleanliness are, however, important for fabrication of optoelectronic devices. The uniformity of the wire density in an AuCP/PET derived TCE is examined under SEM over 1.2×1.2 mm². As many as 400 images are collected (FIG. 17a) to cover this area and the metal fill factor estimated (using imageJ software) from each image (60×60 μm²) is depicted in FIG. 17b. Interestingly, the fill factor shows a standard deviation of 2.1% for mean value of 14.8%. It is clear from the SEM measurements that the Au wires are spatially distributed in a continuous network all over the TCE area leaving no region larger than an average polygon. In FIG. 17c, one can actually follow individual wires and realize how they branch out and connect endlessly from one end to the other. Accordingly, the mean Rs value measured for a grid of 25 mm² areas (total area, 3.5×7 cm², FIG. 17d) is found to be 4.7±1 Ω/square. The Optical micrograph shown in the FIG. 17(e) clearly demonstrates the surface cleanness of the Au wire Banned through crackle lithography.

In yet another embodiment of the present disclosure, the MCP wire width and thickness are varied as shown in Table-4.

TABLE 4

AgCP/PET derived TCEs with various wire widths and thicknesses

| S. No. | Average wire width (~μm) | Wire thickness (nm) | Sheet resistance (Ω/square) | specular trasmittance at 550 nm (%) |
|---|---|---|---|---|
| 1 | 2 | 550 | 1.49 | 83.7 |
| 2 | 3.2 | 550 | 1.07 | 86.1 |
| 3 | 4.1 | 550 | 0.88 | 83.1 |
| 4 | 6.14 | 550 | 0.78 | 88.1 |
| 5 | 4 | 100 | 2.66 | 87.6 |
| 6 | 4 | 300 | 2.00 | 86.0 |
| 7 | 4 | 425 | 1.23 | 83.1 |
| 8 | 4 | 550 | 0.95 | 84.6 |
| 9 | 4 | 850 | 0.55 | 82.5 |

The transmittance of crackle networks (AgCP/PET) with different crackle widths is shown in FIG. 18(a). The average crackle width is calculated through the following formula.

(Metal wire area)/(Metal wire perimeter excluding the edges) =

$(a \times b)/(2 \times b) = a/2 =$ half of average wire width

Image J software is used to calculate the fill factor and crackle width. The cell size is increasing with the average wire width, keeping the fill factor constant (see FIG. 18(b)). The optical micrographs of the Ag network with 2, 3.2, 4.1 and 6.2 corresponding the crackle coating thickness 0.95, 1.39, 2.71 and 3.65 μm respectively, are shown in FIG. 18(c). Photograph of AgCP/PET derived TCEs is shown in FIG. 18(d).

The electrical measurement of AuCP/glass is shown here as an example. The two probe I-V characteristics are linear with the two probe resistance of 6.5Ω for an electrode spacing of 1 mm, MCP thickness 55 nm (see FIG. 19(a)). The temperature dependent resistance is measured from 298 to 77 K (see FIG. 19(b)). The decrease in resistance with decreasing temperature demonstrates, as expected, the metallic behavior of the Au network, the slight deviation from linearity being due to the presence of boundary wall (M. M. A. Yajadda, K. H. Muller, and K. Ostrikov, *Physical Review B* 84, 235431 (2011)). Temperature coefficient of resistance (TCR) is calculated to be $\alpha = 11 \times 10^{-4}$ K$^{-1}$, which is nearly three times less compared to the bulk value ($\alpha = 37 \times 10^{-4}$ K$^{-1}$). The observed lower value of TCR is due to the scattering of electrons at the edges and boundaries of the Au network. However, this value is close to that obtained in the case of Au thin films ($\alpha = 6.67 \times 10^{-4}$ K$^{-1}$). The resistivity is calculated by the following equation, $$\rho_{CP} = R_s \times t_{CP}$$

and $$V_{CP} = L \times W \times FF \times t_{film}$$
$$= L \times W \times [FF \times t_{film}]$$
$$= L \times W \times t_{CP}$$

where $\rho_{CP}$=Resistivity of MCP
$R_s$=Four probe sheet resistance of MCP=3.8 Ω/square
$t_{CP}$=Thickness of MCP film=20 nm
$V_{CP}$=Volume of MCP=10.8×10$^{-6}$ mm$^3$
W=Width of the electrode=0.45 mm
L=Length of the electrode=1.2 mm
FF=Metal fill factor=20%
$t_{film}$=Thickness of metal film=100 nm The resistivity of AuCP/glass ($\rho_{AuCP/glass}$=6.2×10$^{-8}$ Ω-m) is comparable to the bulk resistivity of Au ($\rho_{Au\ bulk}$=2.4× 10$^{-8}$ Ω-m). The TCEs fabricated through crackle lithography are quite stable for 8 months without any decrease in the resistance.

For flexible electronic applications, PET is the most preferred substrate as it, besides being flexible, offers good adhesion to metals. In order to access the suitability of MCP based TCEs in the instant disclosure, several mechanical tests are carried out on an AgCP/PET. During the scotch tape test (FIG. 20(a)), its resistance is found practically unaffected (FIG. 20(b)) and there is no noticeable sign of damage due to peeling off the adhesive tape. The same substrate is then dipped in an ultrasonic bath (FIG. 20(c)) and the resistance change is again insignificant (see FIG. 20(d)). The AgCP is indeed intact. During the bending test (FIG. 20(e)), it is gradually bent to 5.9 mm diameter with a force of 0.89 N (black squares) and relaxed (red circles). The bending cycle is repeated over several thousand times in tension and compression modes (FIG. 20(f)) using an automated setup (see inset) and the change in the resistance is less than ~0.5Ω. The above tests clearly demonstrate the mechanical robustness of the AgCP/PET electrodes produced using crackle lithography. In another instance using glass as substrate, an Au-CrCP electrode is dipped in concentrated sulfuric acid (FIGS. 20(g) and (h)), and it is observed that the electrode could withstand the harsh chemical bath.

Thus, the present disclosure typically provides a low cost, three step method to produce large area transparent conducting electrodes using crackle lithography. It makes use of eco-friendly solvents, commonly available substrates like glass and PET with cheap sacrificial layer and simple metal deposition system. The sacrificial layer is vacuum compatible. It takes just few hours to make a TCE with reproducible metal fill factor over large area. The metal washed away during lift-off can be easily recovered. The MCP based TCE is a single continuous network of flat and smooth metal micro/nanowires with seamless junctions. Several TCEs with different metals like Au, Ag, Cu, Pd, Al, Zn on different substrates, glass, quartz and PET can be easily prepared. The method, with low values of sheet resistance 0.5 Ω/square at T~83% can be easily obtained by controlling the wire thickness. The TCEs reported in the instant disclosure excel in wide spectral range transmittance, and also exhibit high performance in terms of flexibility, chemical and mechanical stability and can be extended to other specialty substrates such as curved surfaces.

2. Transparent Heater

The TCE fabricated in this disclosure is tested as transparent heater by applying external bias. For transparent heater application, thermally resistant substrates such as quartz, mica or even glass and PET can be used depending on the temperature range desired. In FIG. 21(a) the temperature profiles achieved with AuCP/quartz (T, 90% and $R_s$, 2.4 Ω/square) with different voltages are shown. In each case, the temperature reached a plateau maximum in a matter of seconds (response time), and the maximum temperature is found to vary linearly with the supplied power (see FIG. 21(b)) with a slope of ~184° C. $cm^2W^{-1}$. From the IR images in FIG. 21(c), the temperature distribution is seen uniform across the TCE except at the edges, which incur additional heat loss. Importantly and uniquely, the TCE presented in this disclosure is capable of reaching annealing temperatures of over 600° C. within seconds. The maximum temperature achieved against the response time is shown in FIG. 21(d), which demonstrate decrease in the response with increase in the saturation temperature.

3. Transparent Heater on Curved Surfaces

The MCP fabrication using crackle lithography is also extended to curved surfaces such as a cylindrical surface; optical profile is shown in FIG. 22(a). This reveals the interconnectivity of AgCP on curved surfaces as well. The photograph of the TCE fabricated on glass tube is shown in FIG. 22(b). The thermal image of the TCE fabricated on glass tube after application of 20V bias is shown in FIG. 22(c). The thermal image demonstrates that the temperature of the tube is ~80° C. The TCE is fabricated even on convex lens using crackle lithography. The photograph and thermal image is shown in FIGS. 22(d) and 22(f). The optical micrograph of AgCP is shown in FIG. 22(e).

4. Defrosting Window

In order to demonstrate the defrosting of AgCP/glass, the ice is allowed to freeze on AgCP/glass by placing the TCE over container having liquid nitrogen, which becomes completely opaque (FIG. 23(a)). After applying ~8.5 V for 2 min resulting in a temperature rise up to ~150° C., the ice layer starts melting. As seen in the zoom-in images below, the frost melts immediately resulting in a clearly visible display board (see FIGS. 23(b) and 23(c)).

5. Polymer Solar Cell

A polymer solar cell is fabricated as shown in the schematic of FIG. 24(a) with AgCP/PET as TCE. The J-V characteristics of the solar cell under AM 1.5 illumination with an intensity of 80 mW/$cm^2$ is shown in in FIG. 24(a). The device shows a high performance with $V_{oc}$=0.33 V and $J_{sc}$=14.11 mA/$cm^2$. The high current density is due to the highly interconnected AgCP/PET derived TCE. Further, the LBIC mapping is performed on this device, corresponding image and photograph of the device is as shown in the FIGS. 24(b) and 24(c), respectively. The active area of the device is calculated based on LBIC map. The LBIC map shows a high current in the active area. Thus, the AgCP/PET is demonstrated as a TCE for solar cells.

6. Touchscreen

Schematic shows the configuration of assembled touch screen (see FIG. 25(a)). Since the touch screen is transparent, the computer screen below is clearly visible (see FIG. 25(b)). When the flexible top AgCP film is touched with a stylus or finger, the pressure exerted by the touch causes the two AgCP layer to make a point contact. On touching, power is applied to one of the two AgCP layer through the Cu contact electrode at both ends of the bottom film. When the bottom film is powered, the top Ag CP layer issued to probe the location of the stylus. The high-impedance analog to digital Convertor (A/D) converts the voltage created by the stylus touch from the unpowered top layer into a digital value. The 4-wire analogy interface between the touch panel and the touch-screen controller helps in coordinate measurements. FIG. 25(b) demonstrates the working touch screen interfaced with the computer screen. The invisible scribbling on the touch pad is clearly visible on the screen.

7. Transparent Capacitor

The AgCP electrodes with sheet resistance of 50 Ω/square are used for transparent capacitor farbrication. Solid polymer electrolyte gel comprising of PMMA and ionic liquid (1-ethyl-2-methyl-imidazolium-bis(triflouromethanesulfonyl)imide) is spin coated at 1000 rpm on AgCP/PET electrodes acting as anode and cathode and assembled against each other as demonstrated schematically in FIG. 26(a). The device is encapsulated using pressure sensitive adhesive (3M 467MP). The active device of 1 $cm^2$ area is fabricated as shown in FIG. 26(b). The electric double layer formation across the electrolyte resulted in a specific capacitance of 20.9 μF/$cm^2$ (see FIG. 26(c)).

EMI Shielding:

EMI shielding effectiveness of AgCP/PET electrodes are measured using a horn antenna set up at 2.1 GHz. The samples are held in front of horn and shielding effectiveness is calculated between 12-19 dB.

Recovery of Metal:

During the fabrication of a MCP, after lift-off of the sacrificial layer, the metal deposited on the planar regions of the coat, outside of the crackle, gets washed away with the developing solvent and can be recovered after evaporation.

Example 15

Experimentation Section—Characterization of Transparent Conducting Electrode

Transmittance is measured over a range of 200-3000 nm using a UV/visible/near-IR spectrophotometer from Perkin-Elmer (Lambda 900). Sheet resistance is measured using a 4-Point Probe Station (Jandel Model RM3, London and Techno Science Instruments, India). Current-voltage measurements are performed using a source and measurement unit (Keithley 236). Low temperature measurements are done using THMS600 stage (Linkam Scientific Instruments Ltd., UK). SEM is carried out using a Nova NanoSEM 600 instrument (FEI Co., The Netherlands). Energy-dispersive spectroscopy (EDS) analysis is performed with an EDAX Genesis instrument (Mahwah, N.J.) attached to the SEM column. AFM measurements are performed using di Innova (Bruker, USA) in contact mode. Standard Si cantilevers are used for normal topography imaging. Wyko NT9100 Optical Profiling System (Bruker, USA) is used for height and depth measurements. Thermal imager, Testo 885-2 (Testo, USA), is used to measure temperature and capture the IR images. Image J software is used to perform analysis of the crackle patterns. Flexiblity test was done using an automated Mechmesin Multitest 2.5i unit (UK).

In order to deposit metal, thin Pd layer is physically or chemically deposited over crackled sample by sputtering technique. This Pd acts as seed layer for further deposition of copper by EP and ELD. The copper electroplating solution is prepared by dissolving 230 g of copper sulphate solution in 1 L of water and to that 140 mL of conc.$H_2SO_4$ is added. To electroplate copper over Au network on glass/PET, sample with contact taken with silver as cathode and copper foil as anode. By applying potential between two electrodes the copper starts depositing over gold network and reaction is stopped after obtaining the required thickness.

The copper plating bath used for the electroless deposition of copper contained 3 g of CuSO4, 14 g of sodium potassium tartrate mixed with 4 g of NaOH in 100 mL of distilled water (Solution A). Solution B is an aqueous formaldehyde solution (37.2 wt %). A and B solutions are mixed in a 10:1 ratio. To deposit copper, the gold network on glass/PET substrate is immersed in the freshly prepared mixture for 10 min at room temperature. The plating process is stopped by removing the sample and rinsing with distilled water.

The copper electroplating solution is prepared by dissolving 230 g of copper sulphate solution in 1 L of water and to that 140 mL of conc.$H_2SO_4$ is added. To electroplate copper over Au network on glass/PET, sample with contact taken with silver as cathode and copper foil as anode. By applying potential between two electrodes the copper starts depositing over gold network and reaction is stopped after obtaining the required thickness.

We claim:

1. A composition for obtaining a crackled film on a substrate, said composition consisting of colloidal matter in solvent, wherein the colloidal matter has size ranging from about 10 nm to about 150 nm; wherein the colloidal matter has a uniform particle size distribution; and wherein the colloidal matter in the solvent is in concentration ranging from about 0.05 g/mL to about 2 g/mL.

2. The composition as claimed in claim 1, wherein the colloidal matter is selected from a group comprising acrylic resin nanoparticles, titanium dioxide, potassium-tetraoctylammonium bromide, palladium benzyl thiolate, palladium hexadecyl thiolate coffee powder and colloidal nanoparticles of other substances or any combination thereof; and
   wherein the solvent is selected from a group comprising water, toluene, acetone, chloroform, ethyl alcohol, isopropyl alcohol, ethyl acetate, butyl acetate and methanol or any combination thereof.

3. The composition as claimed in claim 1, wherein the crackled film is obtained by drying of the composition without use of external stimuli.

4. A method of obtaining a composition as claimed in claim 1, said method comprising act of combining colloidal matter of uniform size in solvent at concentration ranging from about 0.05 g/mL to about 2 g/mL to obtain the composition.

5. The method as claimed in claim 4, wherein the uniform size is obtained by agitation followed by filtration of the composition.

6. A substrate consisting of a crackled film obtained by exposure of the substrate to a composition as claimed in claim 1.

7. The substrate as claimed in claim 6, wherein the substrate is selected from a group comprising transparent, translucent and opaque material having flexible substrate surface, rigid substrate surface, rough substrate surface or smooth substrate surface; and
   wherein the flexible substrate is selected from a group comprising PET, leather and petal of a flower; and wherein the rigid substrate is selected from a group comprising mica, quartz, Al plate, ceramic, wood, stainless steel and stone; and wherein the rough substrate is selected from a group comprising unpolished Silicon and paper; and wherein smooth substrate is selected from a group comprising silicon, glass and mica.

8. The substrate as claimed in claim 6, wherein the crackled film is obtained by drying of the composition without use of external stimuli; and wherein crackles in the crackled film are interconnected to form a single network.

9. A method of preparing a substrate having a crackled film, said method comprising act of exposing surface of the substrate to the composition as claimed in claim 1, to prepare the substrate having the crackled film.

10. The method as claimed in claim 9, wherein the exposing is carried out by techniques selected from a group comprising drop coating, spin coating, rod coating, roll-to-roll coating and spray coating or any combination thereof.

11. The method as claimed in claim 9, wherein the crackled film is obtained by drying of the composition without use of external stimuli; and wherein said drying is carried out by techniques selected from a group comprising self-evaporation, light exposure, IR radiation, heating, spinning, rotating and cooling, and at temperature ranging from about 200K to about 360K.

12. A patterned substrate comprising the substrate as claimed in claim 8 wherein the crackled film is deposited with a material or energy input.

13. The patterned substrate as claimed in claim 12, wherein the material is selected from a group comprising conductor, semiconductor, insulator and dielectric or any combination thereof; and wherein the energy input is selected from a group comprising electron beam, ion beam, proton flux, light, UV irradiation and IR irradiation or any combination thereof; wherein the patterned substrate is a device or part of a device; and wherein said device is selected from a group comprising conducting electrode, transparent conducting electrode, flexible transparent conducting electrode, heater, transparent heater, flexible transparent heater, solar cell, transparent solar cell, superconductor, transparent superconductor, transparent magnets, transistor, capacitor, transparent capacitor, display, transparent EMI shielding, electrochromic, thermochromic, stretchable electrodes, transparent strain sensor, transparent photo detectors, touch-screen, self-cleaning, super hydrophobic surface and micro channel based microfluidics or any combination thereof.

* * * * *